US009893389B2

(12) United States Patent
Yamamoto et al.

(10) Patent No.: US 9,893,389 B2
(45) Date of Patent: Feb. 13, 2018

(54) POWER STORAGE SYSTEM AND POWER STORAGE METHOD

(71) Applicant: Fujikura Ltd., Tokyo (JP)

(72) Inventors: Kazuhiro Yamamoto, Sakura (JP); Kenichi Okada, Sakura (JP); Ryoji Yanagimoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/507,392

(22) PCT Filed: Dec. 17, 2015

(86) PCT No.: PCT/JP2015/085345
§ 371 (c)(1),
(2) Date: Feb. 28, 2017

(87) PCT Pub. No.: WO2016/098852
PCT Pub. Date: Jun. 23, 2016

(65) Prior Publication Data
US 2017/0294691 A1 Oct. 12, 2017

(30) Foreign Application Priority Data

Dec. 18, 2014 (JP) ................................ 2014-256362

(51) Int. Cl.
*H02J 7/00* (2006.01)
*H01M 10/48* (2006.01)
(Continued)

(52) U.S. Cl.
CPC ......... *H01M 10/482* (2013.01); *H01M 10/44* (2013.01); *H02J 3/32* (2013.01);
(Continued)

(58) Field of Classification Search
USPC ....................................................... 320/164
See application file for complete search history.

(56) References Cited

U.S. PATENT DOCUMENTS 8,441,228 B2 * 5/2013 Brabec ................ B60L 11/1861
320/104
2012/0013175 A1 * 1/2012 Newman, Jr. ......... B60R 16/033
320/109
(Continued)

FOREIGN PATENT DOCUMENTS

JP 6-3106 A 1/1994
JP 10-210681 A 8/1998
(Continued)

OTHER PUBLICATIONS

Notice of Reasons for Refusal dated Aug. 18, 2015, issued in counterpart Japanese Patent Application No. 2014-256362 in Japanese (2 pages).
(Continued)

*Primary Examiner* — Robert Grant
(74) *Attorney, Agent, or Firm* — Westerman, Hattori, Daniels & Adrian, LLP

(57) ABSTRACT

A power storage system of the invention, includes: a power generator; a first storage battery; a second storage battery having smaller capacitance than that of the first storage battery; a first switcher that connects or disconnects the first storage battery to or from a power supply line and a load device; a second switcher that connects or disconnects the second storage battery to or from the power supply line and the load device; a first switching unit that compares a voltage supplied to the load device with first and second predetermined threshold voltages and controls the first switcher according to a result of the comparison; and a second switching unit that compares the voltage supplied to the load device with third and fourth predetermined threshold voltages and controls the second switcher according to a result of the comparison.

7 Claims, 16 Drawing Sheets

(51) Int. Cl.
*H02J 3/32* (2006.01)
*H01M 10/44* (2006.01)
*H02J 7/34* (2006.01)
*H02J 9/02* (2006.01)

(52) U.S. Cl.
CPC .......... *H02J 7/0006* (2013.01); *H02J 7/0078* (2013.01); *H02J 7/34* (2013.01); *H02J 9/02* (2013.01)

(56) References Cited

U.S. PATENT DOCUMENTS

2013/0038268 A1* 2/2013 Markku .......... H01L 31/022433
                                                    320/101
2013/0113430 A1* 5/2013 Kim ................... H02J 7/0032
                                                    320/134
2016/0322859 A1   11/2016 Yamamoto et al.

FOREIGN PATENT DOCUMENTS

| | | |
|---|---|---|
| JP | 2006-158043 A | 6/2006 |
| JP | 2013-78235 A | 4/2013 |
| WO | 2014/128745 A1 | 8/2014 |
| WO | 2015/099158 A1 | 7/2015 |

OTHER PUBLICATIONS

Notice of Allowance dated Nov. 17, 2015, issued in counterpart Japanese Patent Application No. 2014-256362 in Japanese (3 pages).

Office Action dated Sep. 19, 2017, issued in counterpart Chinese Application No. 201580046180.X. (5 pages).

* cited by examiner

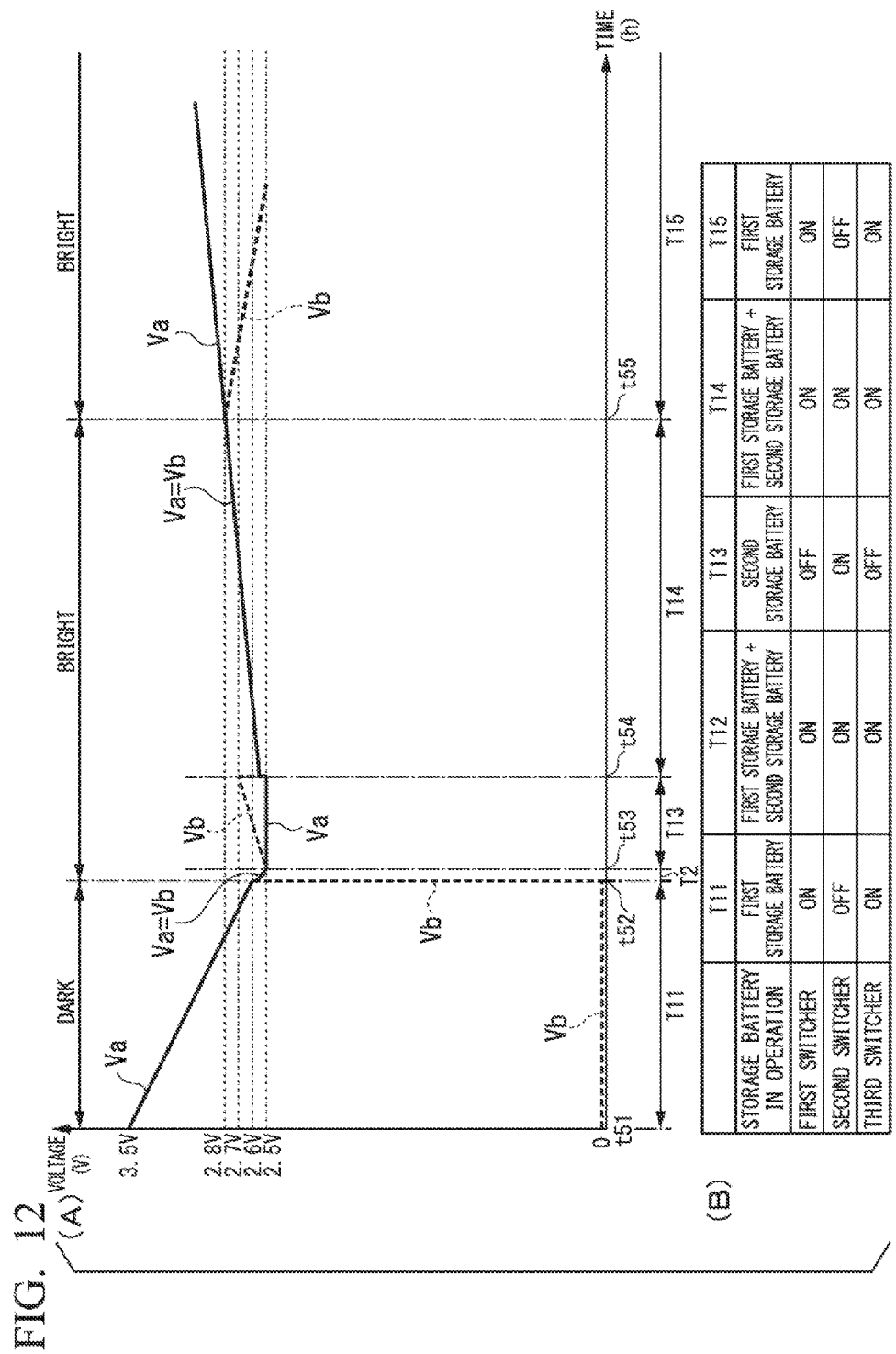

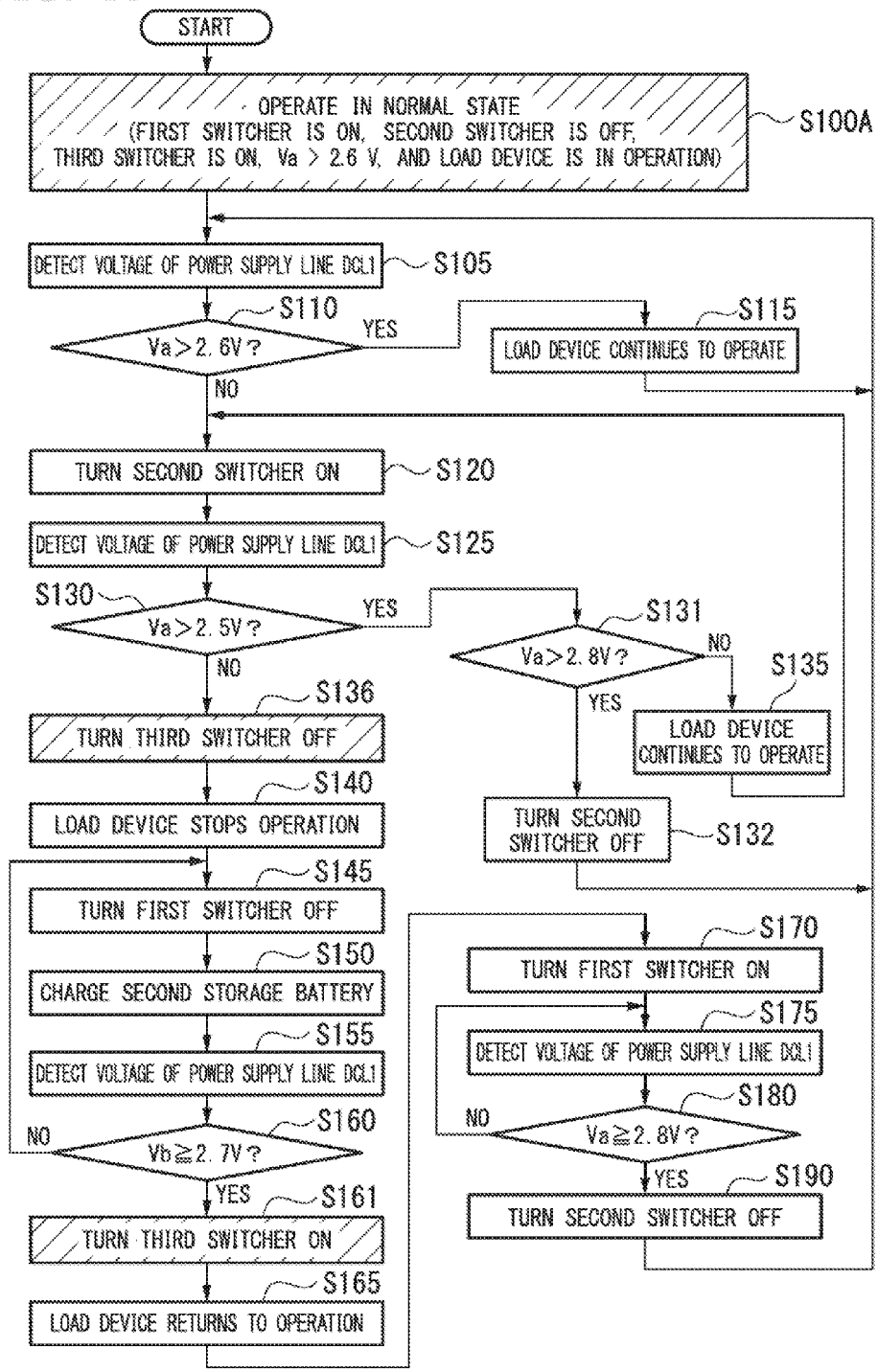

POWER STORAGE SYSTEM AND POWER STORAGE METHOD

TECHNICAL FIELD

The present invention relates to a power storage system and a power storage method of storing power generated by a power generator that performs environmental power generation in a storage battery and supplying the power to a load device.

This application claims priority from Japanese Patent Application No. 2014-256362, filed on Dec. 18, 2014, the contents of which are incorporated herein by reference in their entirety.

BACKGROUND ART

In recent years, energy harvesting devices (environmental power generators) such as wireless sensors or remote control switches that operate without wiring or battery replacement by obtaining electrical energy from the surrounding environment due to realization of low power consumption of an electronic circuit or a wireless technology have attracted attention. Therefore, for example, a low-illuminance dye-sensitized solar battery for energy harvesting assumed to be used in indoor light of a fluorescent light, LED illumination, or the like has been developed.

There is a power supply device using a related lithium ion capacitor (see Patent Document 1). The power supply installation device described in Patent Document 1 is a power supply device including a lithium ion capacitor, and includes a power controller that operates the lithium ion capacitor in a voltage range from 2.0 V to 3.2 V.

Lithium ion capacitors that are commercially available are mainly lithium ion capacitors with 40 F (farads) or more, such as 40 F or 100 F. Further, it is preferable for a lithium ion capacitor to be used at a voltage of 2.0 V or higher from the viewpoint of prevention of deterioration of cells, as described in Patent Document 1. Therefore, a power supply device prevents a voltage of a lithium ion capacitor from becoming a voltage of 2.5 V or lower, for example, in consideration of a margin. Therefore, when a charging voltage of a lithium ion capacitor decreases and is lower than 2.5 V, an operation of a load device is temporarily stopped and supply of power is stopped. Thereafter, in the power supply device, if the power generator starts power generation, recharging of the lithium ion capacitor is started by the power generator.

PRIOR ART DOCUMENTS

Patent Documents

[Patent Document 1] Japanese Unexamined Patent Application, First Publication No. 2013-78235

SUMMARY OF INVENTION

Problems to be Solved by the Invention

When an operation of a load device returns immediately after a charging voltage of a lithium ion capacitor exceeds 2.5 V when the lithium ion capacitor is recharged, operation start and operation stop of the load device are repeated due to power consumption of the load device. That is, the return of the operation of the load device, a decrease in the charging voltage of the lithium ion capacitor due to power consumption at the time of the return of the operation of the load device, and stop of the operation of the load device due to the decrease in the charging voltage are repeated. Thus, it is not possible to drive a system.

Further, when the load device is a communication device such as a sensor node that measures information on an environment, it is desirable for an operation of the system to return approximately ten minutes after a power generator starts power generation. However, in a power supply device of the related art, since charging is performed in a lithium ion capacitor with large capacitance such as 40 F, an output voltage to be supplied to the load device cannot be rapidly increased, and a long amount of time is taken to return the operation of the load device to restitution.

The invention has been made in view showing the above problems, and provides a power storage system and a power storage method capable of causing an operation of a load device to return in a short amount of time when a power generator performs power generation.

Means for Solving the Problems

To solve the above problem, it is necessary to provide a hysteresis width between a voltage at the time of stop of an operation and a voltage at the time of return of the operation. For example, a minimum voltage required to return an operation of a load device is set to, for example, 2.7 V (with a margin of 0.2 V) after recharging of a lithium ion capacitor starts. However, for example, when the voltage of a capacitor with a capacitance of 40 F is charged from 2.5 V to 2.7 V to return the operation of the load device, a charging current supplied from an environmental power generator is small. Accordingly, for example, a long charging time such as several hours is required and the load device is stopped for several hours. The inventors have derived the invention as a result of further intensive research.

In order to achieve the above object, a power storage system according to a first aspect of the invention includes: a power generator that performs environmental power generation; a first storage battery that is supplied with power generated by the power generator; a second storage battery having smaller capacitance than that of the first storage battery; a first switcher that connects or disconnects the first storage battery to or from a power supply line for the power generated by the power generator and a load device; a second switcher that connects or disconnects the second storage battery to or from the power supply line for the power generated by the power generator and the load device; a first switching unit that compares a voltage supplied to the load device with first and second predetermined threshold voltages and controls the first switcher according to a result of the comparison; and a second switching unit that compares the voltage supplied to the load device with third and fourth predetermined threshold voltages and controls the second switcher according to a result of the comparison, wherein the third threshold voltage is set to be higher than the first threshold voltage, the second threshold voltage is set to be higher than the third threshold voltage, and the fourth threshold voltage is set to be higher than the third threshold voltage, wherein the first switching unit performs control such that the first switcher enters an open state when the voltage supplied to the load device becomes equal to or lower than the first threshold voltage, performs control such that a current state of the first switcher is held when the voltage supplied to the load device becomes higher than the first threshold voltage and lower than the second threshold voltage, and performs control such that the first switcher enters a connected state when the voltage supplied to the load device becomes equal to or higher than the second threshold voltage, and wherein the second switching unit performs control to cause the second switcher to enter the connected state so that the first storage battery is connected in parallel with the second storage battery when the voltage supplied to the load device becomes equal to or lower than the third threshold voltage, performs control such that a current state of the second switcher is held when the voltage supplied to the load device becomes higher than the third threshold voltage and lower than the fourth threshold voltage, and performs control to cause the second switcher to enter an open state so that the second storage battery connected in parallel with the first storage battery is disconnected from the first storage battery when the voltage supplied to the load device becomes equal to or higher than the fourth threshold voltage.

In the power storage system having such a configuration, in a state in which the power generator stops power generation or when the power generation amount of the power generator is smaller than the power consumption amount of the load device, the first storage battery supplies the power to be consumed when the load device operates. Accordingly, the charging voltage thereof gradually decreases. When the charging voltage of the first storage battery decreases to the third threshold voltage (the third threshold voltage is greater than the first threshold voltage), the second switching unit causes the second switcher to enter the connected state and connects the second storage battery in parallel with the first storage battery. Accordingly, the charging from the first storage battery to the second storage battery is performed and the charging voltage of the second storage battery increases.

Thereafter, when the charging voltages of the parallel circuit of the first storage battery and the second storage battery further decrease to the first threshold voltage (the third threshold voltage is greater than the first threshold voltage), the first switching unit causes the first switcher to enter the open state and disconnects the first storage battery from the power supply line and the load device. Thereafter, when the power generator performs the power generation, the power generator starts charging of the second storage battery via the second switcher. When the charging voltage of the second storage battery reaches the second threshold voltage (the second threshold voltage is greater than the third threshold voltage), the first switching unit causes the first switcher to enter the connected state, connects the first storage battery to the power supply line and the load device again, and connects the first storage battery in parallel with the second storage battery.

Thereafter, when the charging continues from the power generator to the parallel circuit of the first storage battery and the second storage battery and the charging voltages of the parallel circuit reach the fourth threshold voltage (the fourth threshold voltage is greater than the third threshold voltage), the second switching unit causes the second switcher to enter the open state and disconnects the second storage battery from the first storage battery.

Thus, when the charging voltage of the first storage battery decreases to the third threshold voltage in a state in which the power generator stops the power generation or when the power generation amount of the power generator is smaller than the power consumption amount of the load device, the power storage system of this embodiment connects the first storage battery in parallel with the second storage battery, performs charging from the first storage battery to the second storage battery, and increases the charging voltage of the second storage battery in advance. Thereafter, when the power generator performs the power generation, the second storage battery is selected and charging is performed from the power generator. Accordingly, the voltage that is supplied to the load device rapidly increases.

Accordingly, in the power storage system according to the first aspect of the invention, it is possible to return an operation of a load device in a short amount of time when a power generator performs power generation.

Further, since the charging voltage of the second storage battery with small capacitance increases in a short amount of time, the charging voltage can increase to a voltage equal to or greater than the second threshold voltage in a short amount of time. Therefore, the power storage system can cause the operation of the load device to return in a short amount of time.

Further, when the voltage of the first storage battery decreases to the third threshold voltage, the second storage battery is connected in parallel with the first storage battery and the second storage battery reaches the same voltage as the first storage battery. Therefore, if the voltage of the first storage battery becomes equal to or lower than the first threshold voltage, the first switcher enters the open state, and the second switcher enters the connected state, charging of the second storage battery is started from the potential of the second storage battery at that time. Therefore, the power storage system can charge the second storage battery to a voltage equal to or higher than the second threshold voltage in a short amount of time. Accordingly, the power storage system can cause the operation of the load device to return in a short amount of time.

Further, in the power storage system according to the first aspect of the invention, the third threshold voltage may be set to a voltage at which the voltage of the first storage battery does not become equal to or lower than the first threshold voltage when the first storage battery is connected in parallel with the second storage battery when the voltage of the second storage battery is 0 V or has a value close to 0 V.

In the power storage system having such a configuration, the third threshold voltage is set so that a voltage when the voltages of the first storage battery and the second storage battery are combined becomes equal to or higher than the first threshold voltage by connecting the first storage battery in parallel with the second storage battery even when the voltage of the second storage battery is 0 V.

That is, the third threshold voltage is set so that "charge amount of the first storage battery at the third threshold voltage is greater than (charge amount of the first storage battery at the first threshold voltage+charge amount of the second storage battery at the first threshold voltage)."

Accordingly, when the voltage of the first storage battery becomes the third threshold voltage and the first storage battery is connected in parallel with the second storage battery, it is possible to prevent the voltage of the first storage battery from being equal to or lower than the first threshold voltage.

Further, the power storage system according to the first aspect of the invention may include a third switcher that connects or opens the power supply line that supplies power to the load device and the load device, wherein the first switcher may perform control so that the third switcher enters an open state when the voltage supplied to the load device becomes equal to or lower than the first threshold voltage, and perform control so that the third switcher enters a connected state when the voltage supplied to the load device becomes equal to or higher than the second threshold voltage after the third switcher enters the open state.

In the power storage system having such a configuration, when the voltage supplied to the load device becomes equal to or lower than the first threshold voltage, the first switching unit causes the third switcher to enter the open state and stops the supply of power from the power storage system to the load device. On the other hand, when the charging voltage supplied to the load device reaches the second threshold voltage after the first switching unit causes the third switcher to enter the open state, the first switching unit causes the third switcher to enter the connected state and starts the supply of power from the power storage system to the load device.

Accordingly, the power storage system of the first aspect of the invention can cause the third switcher to enter the open state and stop the supply of power to the load device in a state in which the power storage system cannot supply required power to the load device, and can cause the third switcher to enter the connected state and supply the power to the load device in a state in which the power storage system can supply the required power to the load device. Further, it is not necessary for the load device itself to determine whether or not the power supply voltage supplied from the power storage system is a power supply voltage necessary for the load device itself to operate.

In the power storage system according to the first aspect of the invention, the first storage battery may be a capacitor with a leakage current lower than that of the second storage battery.

In the power storage system having such a configuration, the first storage battery is a capacitor that holds power for a long amount of time. In order for stored power not to be wastefully consumed, a capacitor with a low leakage current is used as the first storage battery. On the other hand, the second storage battery is a capacitor that is used only in a short amount of time from a point in time at which the second storage battery is connected in parallel with the first storage battery due to the charging voltage of the first storage battery decreasing to the third threshold voltage or lower to a point in time at which the charging voltages of the first storage battery and the second storage battery reach the fourth threshold voltage when the power generator performs power generation. Therefore, in the power storage system, a capacitor with a high leakage current can be used as the second storage battery.

Accordingly, the first storage battery can hold the power for a long amount of time without wastefully consuming the stored power. Therefore, the power storage system of the invention can operate the load device for a long amount of time even when the power generator stops the power generation or when the power generation amount of the power generator is smaller than the power consumption amount of the load device.

Further, the power storage system according to the first aspect of the invention may include a DC/DC converter that converts the output voltage of the power generator into a predetermined voltage and supplies the voltage to the first storage battery and the second storage battery, and the DC/DC converter may control the output voltage so that the charging voltage of the first storage battery does not exceed a predetermined upper limit voltage.

In the power storage system having such a configuration, the DC/DC converter is connected to the output side of the power generator. This DC/DC converter converts the output voltage Vs of the power generator into a voltage according to the power supply voltage to be supplied to the load device.

Using the converted voltage, the DC/DC converter performs supply of power to the first storage battery when the first switcher is in a connected state, performs supply of power to the second storage battery when the second switcher is in a connected state, and performs charging of the parallel circuit of the first storage battery and the second storage battery when the first switcher and the second switcher are in the connected state. Further, the DC/DC converter performs control so that the output voltage does not exceed a predetermined upper limit voltage, to thereby prevent the first storage battery from being overcharged.

Accordingly, the power storage system of the invention can convert the output voltage of the power generator into a voltage at which the load device can be operated. Further, the DC/DC converter can prevent the first storage battery from being overcharged.

Further, in the power storage system according to the first aspect of the invention, the first storage battery may be a lithium ion capacitor.

In the power storage system having such a configuration, it is necessary for the first storage battery with large capacitance to hold charge for a long amount of time. Therefore, a lithium ion capacitor with a low leakage current is used as the first storage battery.

Thus, the first storage battery can hold the power supplied from the power generator for a long amount of time by preventing the power from being wastefully consumed. Therefore, the power storage system of the invention can operate the load device for a long amount of time when the power generator stops the power generation or when the generated power amount of the power generator is smaller than the power consumption amount of the load device.

In order to achieve the above object, a power storage method according to a second aspect of the invention includes preparing a power storage system including a power generator that performs environmental power generation, a first storage battery that is supplied with power generated by the power generator, a second storage battery having smaller capacitance than that of the first storage battery, a first switcher that connects or disconnects the first storage battery to or from a power supply line for the power generated by the power generator and a load device, a second switcher that connects or disconnects the second storage battery to or from the power supply line for the power generated by the power generator and the load device, a first switching unit that compares a voltage supplied to the load device with first and second predetermined threshold voltages and controls the first switcher according to a result of the comparison, and a second switching unit that compares the voltage supplied to the load device with third and fourth predetermined threshold voltages and controls the second switcher according to a result of the comparison, wherein the third threshold voltage is set to be higher than the first threshold voltage, the second threshold voltage is set to be higher than the third threshold voltage, and the fourth threshold voltage is set to be higher than the third threshold voltage; performing, by the first switching unit, control such that the first switcher enters an open state when the voltage supplied to the load device becomes equal to or lower than the first threshold voltage, performing control such that a current state of the first switcher is held when the voltage supplied to the load device becomes higher than the first threshold voltage and lower than the second threshold voltage, and performing control such that the first switcher enters a connected state when the voltage supplied to the load device becomes equal to or higher than the second threshold voltage (first control step); and performing, by the second switching unit, control to cause the second switcher to enter the connected state so that the first storage battery is connected in parallel with the second storage battery when the voltage supplied to the load device becomes equal to or lower than the third threshold voltage, performing control such that a current state of the second switcher is held when the voltage supplied to the load device becomes higher than the third threshold voltage and lower than the fourth threshold voltage, and performing control to cause the second switcher to enter an open state so that the second storage battery connected in parallel with the first storage battery is disconnected from the first storage battery when the voltage supplied to the load device becomes equal to or higher than the fourth threshold voltage (second control step).

Accordingly, in the power storage method according to the aspect of the invention, it is possible to return the operation of the load device in a short amount of time when the power generator performs power generation.

Effects of the Invention

According to the power storage system according to the aspect of the invention, it is possible to return the operation of the load device in a short amount of time when the power generator performs power generation.

BRIEF DESCRIPTION OF THE DRAWINGS

FIG. 12 is an image diagram showing a case in which the power storage system according to the second embodiment transitions from a normal state to a state of a voltage close to a state of a voltage close to a state of a voltage close to an over-discharge state and then returns to the normal state again.

FIG. 16 is a flowchart showing a procedure of a process in the power storage system according to the second embodiment.

EMBODIMENTS FOR CARRYING OUT THE INVENTION

Hereinafter, embodiments of the invention will be described with reference to the drawings.

First Embodiment

Figure 1:
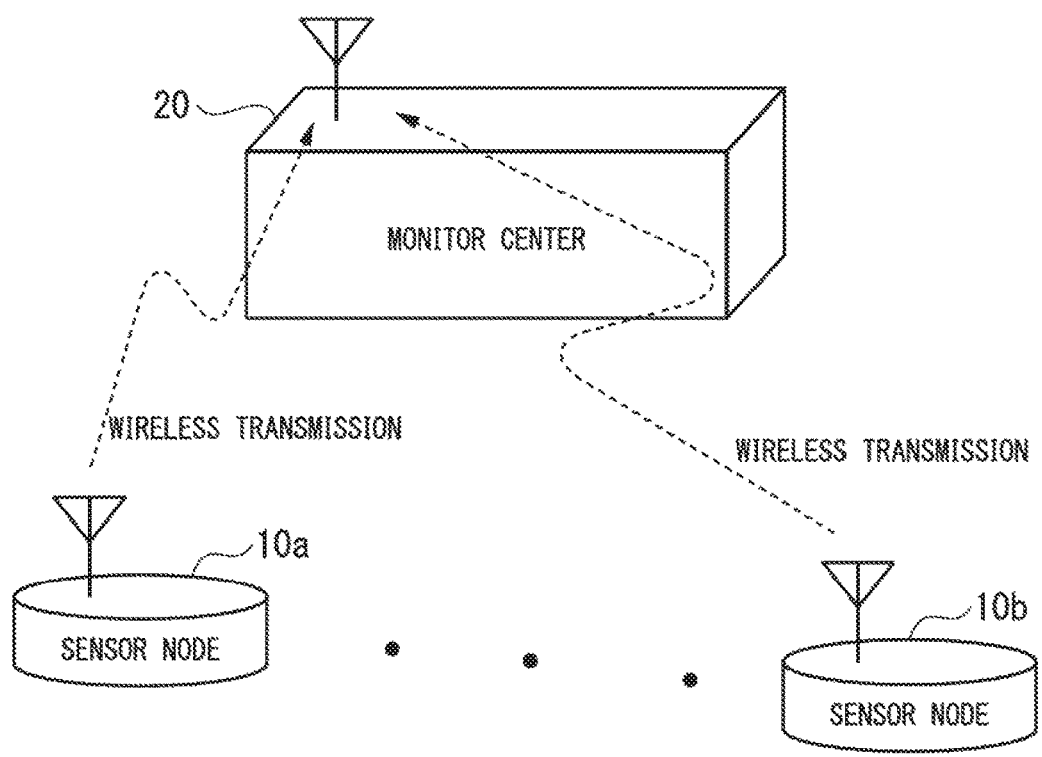
FIG. 1 is an illustrative diagram showing an overview of a wireless sensor system.

FIG. 1 is an illustrative diagram showing an overview of a wireless sensor system 1. As shown in FIG. 1, a wireless sensor system 1 includes a monitor center 20 and sensor nodes 10a and 10b. The sensor nodes 10a and 10b include a power storage system 100 (see FIG. 2) of the invention to be described below.

The monitor center 20 collects measurement results of the ambient environment of the sensor nodes 10a and 10b, and performs arithmetic processing on the collected measurement results. The sensor nodes 10a and 10b wirelessly transmit the measurement results to the monitor center 20.

Here, the measurement results include, for example, information indicating temperature, humidity, $CO_2$ concentration, vibration, water level, illuminance, voltage, current, sound, an image, or the like as information determined by the sensor nodes 10a and 10b. Further, the measurement results may include presence or absence of a person, and a result determined using an infrared sensor or the like. Further, the sensor nodes 10a and 10b may be a stationary device or may be a device in a wall-mounted form or a type that is affixed to a wall.

The sensor nodes 10a and 10b are operated by power supplied by energy harvest (environmental power generation) power supply, and do not require arrangement of a power line or the like. Accordingly, the degree of freedom at the time of the arrangement is enhanced.

In FIG. 1, although two sensor nodes 10a and 10b are shown as sensor nodes, the number of sensor nodes may be one or may be three or more.

Further, the sensor node 10a and the sensor node 10b have the same configuration. In the following description, when either or both of the sensor node 10a and the sensor node 10b are shown, the sensor node 10a and the sensor node 10b are described as a sensor node 10.

Figure 2:
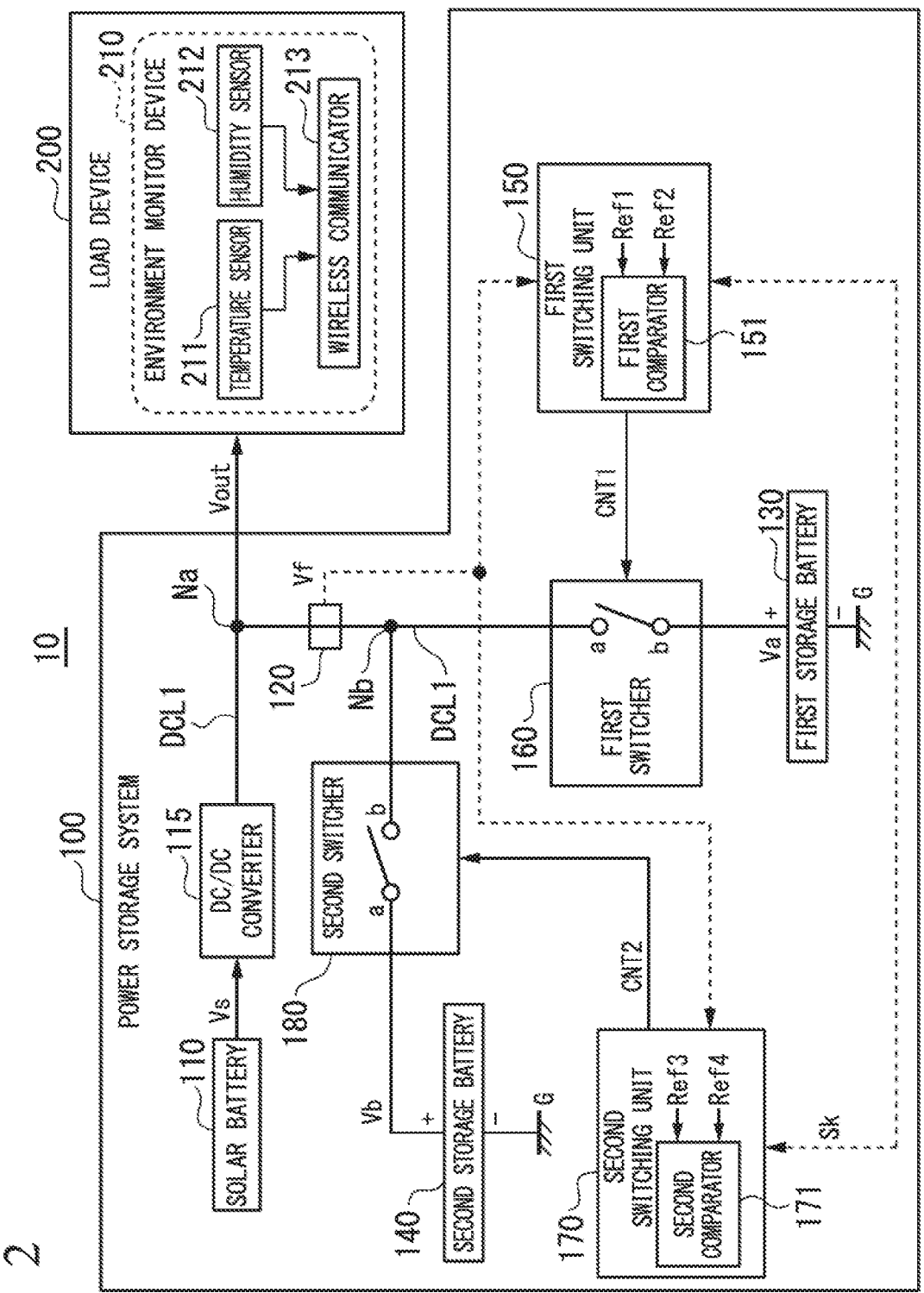
FIG. 2 is a configuration diagram showing a configuration example of a sensor node using a power storage system according to a first embodiment.

FIG. 2 is a configuration diagram showing a configuration example of the sensor node 10 using the power storage system 100 according to this embodiment. The sensor node 10 is, for example, a sensor node that is installed in an interior of an office or the like, and is a sensor node to which power is supplied by solar power generation or indoor light power generation. The sensor node 10 acquires environment information such as temperature and humidity, and periodically wirelessly transmits the environment information to the monitor center 20. For example, the sensor node 10 transmits the environment information to the monitor center 20 at five-minute intervals.

As shown in FIG. 2, the sensor node 10 includes the power storage system 100 that stores, in a storage battery, power generated by a solar battery 110 (a power generator) that performs environmental power generation, and a load device 200 to which power is supplied from the power storage system 100.

The load device 200 is, for example, an environment monitor device 210 that functions as a wireless sensor that operates without a wiring or battery replacement. The environment monitor device 210 includes a temperature sensor 211 that measures a temperature of an interior of an office or the like, and a humidity sensor 212 that measures humidity of the interior. The environment monitor device 210 periodically wirelessly transmits information on the indoor temperature measured by the temperature sensor 211 and information on the indoor humidity measured by the humidity sensor 212 to the external monitor center 20 using a wireless communicator 213.

In the following description, a case in which "the load device 200 stops an operation" means a state in which the load device 200 cannot perform a measurement operation or a communication operation since the load device 200 cannot receive required power supply voltage from the power storage system 100, and is different from a sleep period (pause period) in a case in which the load device 200 performs periodic transmission.

Further, a case in which "the load device 200 returns to the operation" means that, after the load device 200 temporarily stops the operation due to a decrease in power supply voltage, the load device 200 can receive required power supply voltage from the power storage system 100 again and can perform the measurement operation and the communication operation.

First, the load device 200 will be described.

In FIG. 2, the load device 200 is operated with power supplied from the power storage system 100 by receiving an output voltage Vout of the power supply line DCL 1. The load device 200 is configured to start the operation when a power supply voltage (the output voltage Vout) supplied from the power storage system 100 is equal to or higher than, for example, 2.7 V, and stop the operation if the power supply voltage supplied from the power storage system 100 is equal to or lower than, for example, 2.5 V. That is, the load device 200 is configured to stop the operation if the power supply voltage supplied from the power storage system 100 is equal to or lower than, for example, 2.5 V, and returns to the operation if the power supply voltage is equal to or higher than, for example, 2.7 V after the load device 200 temporarily stops the operation, and has a hysteresis characteristic of 0.2 V for the power supply voltage.

The temperature sensor 211 and the humidity sensor 212 are configured with a measurement instrument or a determiner according to use of the sensor node 10. The temperature sensor 211 and the humidity sensor 212 perform measurement under control of the wireless communicator 213 and outputs information indicating an obtained measurement result to the wireless communicator 213. The measurement by the temperature sensor 211 and the humidity sensor 212 is performed, for example, according to a timing at which the wireless communicator 213 performs wireless transmission.

The wireless communicator 213 encodes and modulates the measurement results input from the temperature sensor 211 and the humidity sensor 212 to generate a transmission signal, and periodically transmits the transmission signal to the monitor center 20 through wireless communication. Most power consumption in the environment monitor device 210 occurs when the wireless communicator 213 performs wireless transmission. Further, in this embodiment, in order to reduce power consumption, the wireless communicator 213 does not include a wireless reception function, but the invention is not necessarily limited thereto, and the wireless communicator 213 may include the reception function if necessary.

Further, in a state in which the wireless communicator 213 does not perform the wireless transmission, the environment monitor device 210 proceeds to a sleep state (pause period), thereby reducing power consumption. For example, when a transmission time interval is set to T1 minutes, the environment monitor device 210 enters a sleep state for the T1 minutes and returns to the operation after the T1 minutes have elapsed. When the environment monitor device 210 returns to the operation, the environment monitor device 210 acquires information on the temperature and the humidity again and wirelessly transmits the information. That is, the environment monitor device 210 does not perform the acquisition of the information on the temperature and the humidity or the wireless transmission when asleep.

Figure 3:
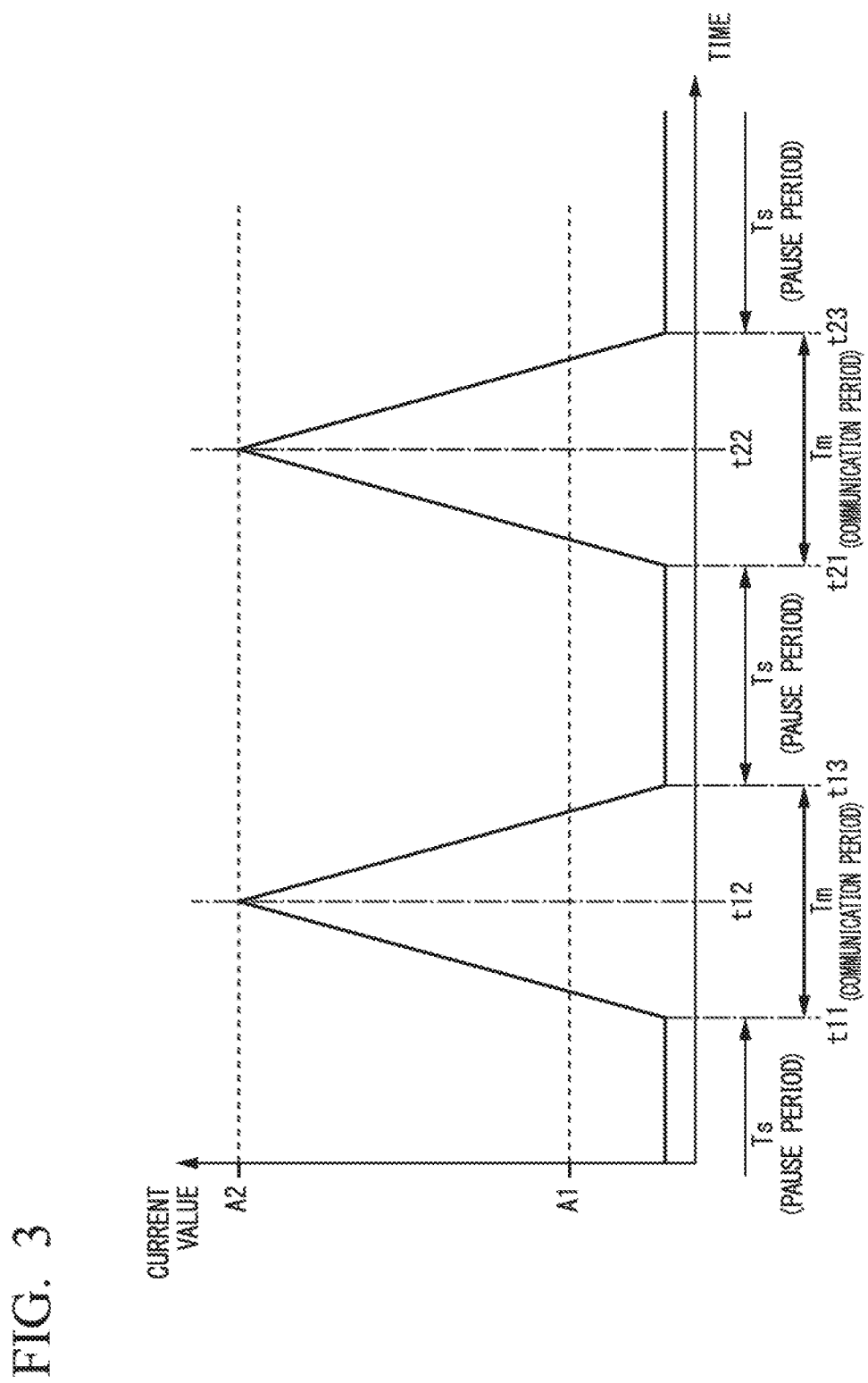
FIG. 3 is an illustrative diagram showing an aspect of current consumption in a load device according to the first embodiment.

FIG. 3 is an illustrative diagram showing an aspect of current consumption in the load device 200 according to this embodiment. In FIG. 3, a horizontal axis indicates time and a vertical axis indicates a magnitude of current consumption. The load device 200 performs transmission, for example, every five minutes. For example, as shown in FIG. 3, the load device 200 starts a communication operation from a time t11 and ends the communication operation at a time t13.

In a communication period Tm from the time t11 to the time t13, a current flows with a peak value in the order of a maximum current A2 (several mA) at a point in time t12. Thereafter, a pause period (sleep period) Ts from the time t13 to the time t21 elapses, the load device 200 starts the communication operation again at the time t21 after five minutes have elapsed from the time t11, and ends the communication operation at a time t23. In the communication period Tm from the time t21 to the time t23, a current flows with a peak value in the order of a maximum current A2 (several mA) at a time t22.

In this case, the current flowing from the power storage system 100 to the load device 200 is, as an average value, a consumption current in the order of current A1 (tens of μA).

Referring back to FIG. 2, the power storage system 100 will be described.

The power storage system 100 supplies power to the load device 200 to operate the load device 200. The power storage system 100 includes a solar battery 110 using an environmental power generator, a DC/DC converter 115, a voltage determiner 120, a first storage battery 130, a second storage battery 140, a first switching unit 150, a first switcher 160, a second switching unit 170, and a second switcher 180.

The solar battery 110 is a solar battery for low illuminance and is, for example, a solar battery that is used with illuminance equal to or lower than 10000 (Lux). In this embodiment, when brightness of a lamp is approximately 200 Lux, power generation capability of the solar battery 110 is approximately 200 to 500 (μW). The solar battery 110 performs charging of the first storage battery 130 and the second storage battery 140 and supply of power to the load device 200 in a period in which a lamp is turned on in an office or the like.

Figure 4A:
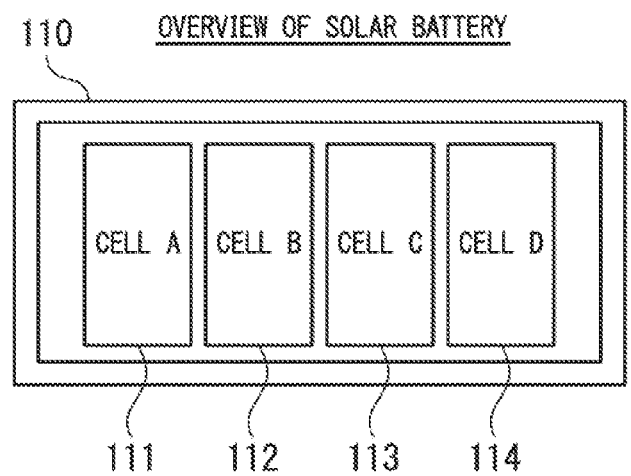
FIG. 4A is a diagram showing an overview of a solar battery according to the first embodiment.
Figure 4B:
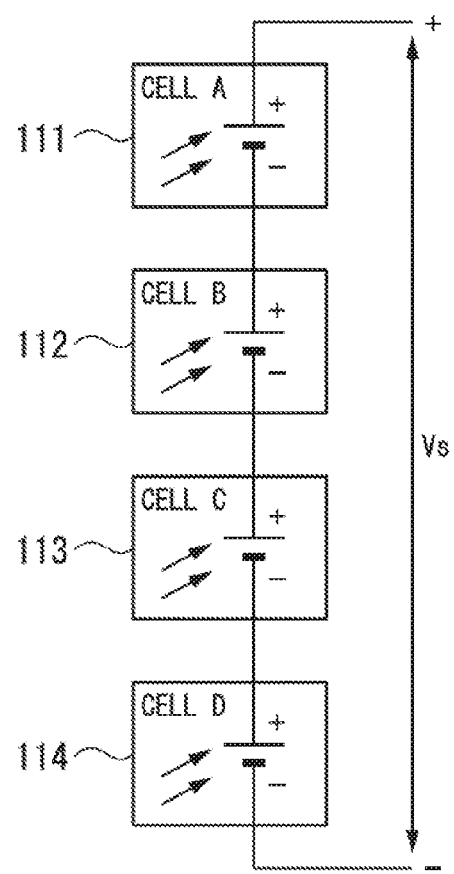
FIG. 4B is an illustrative diagram showing a connected state of the solar battery cell according to the first embodiment.

FIG. 4A is an illustrative diagram showing an overview of the solar battery of the solar battery according to this embodiment. FIG. 4B is an illustrative diagram showing a connected state of the solar battery. As shown in a plan diagram of FIG. 4A, four solar battery cells including a solar battery cell A 111, a solar battery cell B 112, a solar battery cell C 113, and a solar battery cell D 114 are arranged in a plane form on the light reception surface side of the solar battery 110. The four solar battery cells A111 to D114 are configured to be connected in series so that a predetermined output voltage Vs is obtained, as shown in FIG. 4B.

In the solar battery 110 shown in FIGS. 4A and 4B, four solar battery cells including the solar battery cell A 111 to solar battery cell D 114 are connected in series. The number of the solar battery cells connected in series is selected so that the voltage Vs output to the DC/DC converter 115 becomes a voltage at which a boosting operation and a step-down operation are performed at a predetermined efficiency or higher in the DC/DC converter 115. For example, when the solar battery cell is a low-illuminance dye-sensitized solar battery, it is preferable for the number of the solar battery cells connected in series to be, for example, at least three.

Referring back to FIG. 2, the description of the power storage system 100 will be continued.

An input side of the DC/DC converter 115 is connected to an output side of the solar battery 110. The output voltage Vs of the solar battery 110 is input to the DC/DC converter 115. For example, when the output voltage Vs of the solar battery 110 is lower than a voltage required for the load device 200, the DC/DC converter 115 is configured as a boost converter device or the like. The DC/DC converter 115 converts the input voltage Vs into a voltage according to the power supply voltage for the load device 200. Further, the DC/DC converter 115 outputs the converted voltage to the power supply line DCL1, and charges the first storage battery 130 and the second storage battery 140. The output voltage of the DC/DC converter 115 is controlled so as not to exceed a predetermined upper limit voltage (for example, 3.7 V) and prevents the charging voltage Va of the first storage battery 130 from being overcharged. For example, when the input voltage Vs exceeds the upper limit voltage (3.7 V), the DC/DC converter 115 steps down the input voltage to the voltage according to the power supply voltage for the load device 200.

Normally, the power storage system 100 is configured so that the output voltage (power generation voltage) Vs of the solar battery 110 does not exceed the upper limit voltage of the first storage battery 130 even when the output voltage Vs is a maximum voltage.

Further, the DC/DC converter 115 includes an integrated circuit and is configured to be able to set the upper limit value of the output voltage, for example, by adjusting a resistance value of an external resistor.

The voltage determiner 120 is configured with, for example, a resistance voltage division circuit, and determines the output voltage Vout of the power supply line DCL1. The voltage determiner 120 outputs a voltage determination signal Vf of the voltage Vout of the power supply line DCL1 to each of the first switching unit 150 and the second switching unit 170. The voltage determined by the voltage determiner 120 becomes the voltage Va of the first storage battery 130 when the first switcher 160 is in an ON state and the second switcher 180 is in an OFF state. Further, the voltage determined by the voltage determiner 120 becomes the voltage Vb of the second storage battery 140 when the first switcher 160 is in an OFF state and the second switcher 180 is in an ON state. Further, when both of the first switcher 160 and the second switcher 180 are in the ON state, the voltage determination signal Vf determines the voltage Va of the first storage battery 130, and determines the voltage Vb of the second storage battery 140 that is the same voltage as the voltage Va.

There are two or more voltage determiners 120, which may individually determine the voltage Va of the first storage battery 130 and the voltage Vb of the second storage battery 140.

The first storage battery 130 and the second storage battery 140 are charged to store charge by the solar battery 110.

The first storage battery 130 is a lithium ion capacitor (LIC) and is, for example, a lithium ion capacitor with large capacitance of 40 F (farads), which has capacitance larger than that of the second storage battery 140. The lithium ion capacitor with 40 F constituting the first storage battery 130 has a leakage current lower than that of the second storage battery 140. When the first switcher 160 is in the ON state in a period in which a lamp is turned on in an office or the like, the power generated by the solar battery 110 is supplied to the first storage battery 130 via the DC/DC converter 115. Further, when a battery value is equal to or larger than a predetermined value, the first storage battery 130 supplies the power charged in the first storage battery 130 to the load device 200. For example, the first storage battery 130 supplies the power charged in the first storage battery 130 to the load device 200 when the first switcher 160 is in the ON state in a period in which the lamp is turned off in an office or the like.

Further, the lithium ion capacitor of the first storage battery 130 is charged to, for example, a voltage from 2.5 V to 3.7 V at the time of shipment.

The second storage battery 140 is a capacitor with capacitance smaller than the capacitance of the first storage battery 130 and is, for example, an electric double layer capacitor (EDLC) with 1 F (farad). Further, the electric double layer capacitor constituting the second storage battery 140 has a leakage current higher than that of the lithium ion capacitor of the first storage battery 130. When the second switcher 180 is in the ON state in a period in which a lamp is turned on in an office or the like, the power generated by the solar battery 110 is supplied to the second storage battery 140 via the DC/DC converter 115. Further, the second storage battery 140 supplies the power charged in the second storage battery 140 to the load device 200 when the battery value is equal to or greater than the predetermined value.

Since it is necessary for the first storage battery 130 to store charge for a long amount of time, a lithium ion capacitor with a low leakage current is used as the first storage battery 130. On the other hand, the second storage battery 140 is a capacitor that has a grounded negative electrode, is charged in a short amount of time when an operation of the load device 200 returns, and is used only for a short amount of time. Therefore, a capacitor with a leakage current higher than that of the first storage battery 130 can be used as the second storage battery 140.

Further, the capacitance of the first storage battery 130 is not limited to 40 F, and a capacitor with appropriate capacitance can be selected based on the generated power amount of the solar battery 110, the average value of the power consumption of the load device 200, and a time for which the load device 200 is desired to be continuously driven. Further, the capacitance of the second storage battery 140 is not limited to 1 F, and a capacitor with appropriate capacitance can be selected based on the generated power amount of the solar battery 110, the average value of the power consumption of the load device 200, and a time at which the load device 200 is desired to return.

Although FIG. 1 shows an example in which each of the first storage battery 130 and the second storage battery 140 is configured with a storage battery that is a single entity, the first storage battery 130 and the second storage battery 140 may be configured with a plurality of storage capacitors. That is, each of the first storage battery 130 and the second storage battery 140 can be configured with any number of storage capacitors.

The first switching unit 150 includes a first comparator 151. The first comparator 151 compares the voltage determination signal Vf of the voltage Vout of the power supply line DCL1 input from the voltage determiner 120 with predetermined reference voltages Ref1 and Ref2 of the own unit. The first switching unit 150 outputs a control signal CNT1 for turning ON/OFF (connecting/opening) the first switcher 160 to the first switcher 160 according to a comparison result of the first comparator 151.

When the first comparator 151 determines that the voltage Vout of the power supply line DCL1 is equal to or lower than 2.5 V (the first threshold voltage), the first switching unit 150 outputs the control signal CNT1 to cause the first switcher 160 to enter an OFF state. Further, when the first comparator 151 determines that the voltage Vout of the power supply line DCL1 is equal to or higher than 2.7 V (the second threshold voltage) after the first switching unit 150 outputs the control signal CNT1 to cause the first switcher 160 to enter an OFF state, the first switching unit 150 outputs the control signal CNT1 to cause the first switcher 160 to enter the ON state. That is, the first switching unit 150 controls an open or closed state of the first switcher 160 with hysteresis characteristics with a width of 0.2 V between 2.5 V and 2.7 V.

More specifically, when the first switcher 160 is in the ON state, the first comparator 151 compares the voltage determination signal Vf of the voltage Vout of the power supply line DCL1 with the predetermined reference voltage Ref1. The reference voltage Ref1 corresponds to the voltage 2.5 V (the first threshold voltage) that is used when an overdischarge state of the first storage battery 130 is determined. The first comparator 151 determines whether or not the voltage Va of the first storage battery 130 is equal to or lower than 2.5 V by comparing the voltage determination signal Vf of the power supply line DCL1 with the predetermined reference voltage Ref1 in a state in which the first switcher 160 is in the ON state. When the voltage Va of the first storage battery 130 is equal to or lower than 2.5 V, the first switching unit 150 outputs the control signal CNT1 to the first switcher 160 to cause the first switcher 160 to enter the OFF state and disconnect the first storage battery 130 from the power supply line DCL1. Accordingly, the power storage system 100 stops charging of the first storage battery 130 and supply of power from the first storage battery 130 to the load device 200.

Further, when the first switcher 160 is in an OFF state, the first comparator 151 compares the voltage determination signal Vf of the voltage Vout of the power supply line DCL1 with the predetermined reference voltage Ref2. The reference voltage Ref2 corresponds to the voltage 2.7 V (the second threshold voltage) that is used when it is determined whether or not the power storage system 100 returns to a normal state from a state in which supply of power from the first storage battery 130 to the load device 200 stops.

The first comparator 151 compares the voltage determination signal Vf of the power supply line DCL1 with the reference voltage Ref2 to determine whether or not the voltage Vout of the power supply line DCL1 is equal to or higher than 2.7 V when the first switcher 160 is in an OFF state and the second switcher 180 is in the ON state. When the voltage Vout of the power supply line DCL1 is equal to or higher than 2.7 V, the first switching unit 150 causes the first switcher 160 to enter the ON state and connects the first storage battery 130 to the power supply line DCL1. Accordingly, the second storage battery 140 and the first storage battery 130 are connected in parallel, and charging is performed from the second storage battery 140 to the first storage battery 130. When charging from the second storage battery 140 to the first storage battery 130 is performed, the voltage Va of the first storage battery 130 increases.

The first switcher 160 is arranged between the power supply line DCL1 and the first storage battery 130, and turns ON or OFF (connects or disconnects) the power supply line DCL1 and the first storage battery 130 according to instruction content of the control signal CNT1 which is input from the first switching unit 150. The first switcher 160 enters a connected state in the ON state and connects the first storage battery 130 to the power supply line DCL1. Further, the first switcher 160 enters an open state in the OFF state and disconnects the first storage battery 130 from the power supply line DCL1. In the following description, the connected state of the first switcher 160 is described as an ON state, and the open state of the first switcher 160 is described as an OFF state.

One terminal a (a first terminal) of the first switcher 160 is connected to a node Nb of the power supply line DCL1, and the other terminal b (a second terminal) is connected to a positive electrode (+) terminal of the first storage battery 130. The terminal a of the first switcher 160 is connected to the output side of the DC/DC converter 115 via the node Nb and a node Na of the power supply line DCL1. When the first switcher 160 is in the ON state, the first storage battery 130 receives power supplied from the solar battery 110 via the DC/DC converter 115, and supplies the power to the load device 200. When the first switcher 160 is in the ON state, the voltage Va of the positive electrode (+) terminal of the first storage battery 130 (the charging voltage Va of the first storage battery 130) is output as the output voltage Vout to the power supply line DCL1.

In the following description, "the voltage Va of the positive electrode (+) terminal of the first storage battery 130" or "the charging voltage Va of the first storage battery 130" may be simply referred to as "the voltage Va of the first storage battery 130".

The second switching unit 170 includes a second comparator 171. The second comparator 171 compares the voltage determination signal Vf of the voltage Vout of the power supply line DCL1 input from the voltage determiner 120 with predetermined reference voltages Ref3 and Ref4 of the own unit. The second switching unit 170 outputs a control signal CNT2 for turning ON/OFF (connecting/opening) the second switcher 180 to the second switcher 180 according to a comparison result of the second comparator 171.

Further, the first switching unit 150 and the second switching unit 170 may notify each other of information on the open or closed state of the first switcher 160 and information on the open or closed state of the second switcher 180 via a signal line Sk. Accordingly, the first switching unit 150 can confirm the open or closed state of the second switcher 180 to control the open or closed state of the first switcher 160. Further, the second switching unit 170 can confirm the open or closed state of the first switcher 160 to control the open or closed state of the second switcher 180.

When the second comparator 171 determines that the voltage Vout of the power supply line DCL1 is equal to or lower than 2.6 V (the third threshold voltage), the second switching unit 170 outputs the control signal CNT2 to cause the second switcher 180 to enter an ON state. Further, when the second comparator 171 determines that the voltage Vout of the power supply line DCL1 is equal to or higher than 2.8 V (the fourth threshold voltage) after the second switching unit 170 outputs the control signal CNT2 to cause the second switcher 180 to enter an ON state, the second switching unit 170 outputs the control signal CNT2 to cause the second switcher 180 to enter an OFF state. That is, the second switching unit 170 controls the ON and OFF state of the second switcher 180 with hysteresis characteristics with a width of 0.2 V between 2.6 V and 2.8 V.

Although the case in which the fourth threshold voltage (2.8 V) is higher than the second threshold value (2.7) V has been described in the above example, the fourth threshold voltage can be a voltage lower than the second threshold value (2.7) V. When the fourth threshold value is lower than the second threshold value, the second switching unit 170 causes the second switcher 180 to enter the OFF state when the first switcher 160 is in the ON state and the voltage Vout of the power supply line DCL1 is equal to or higher than the fourth threshold voltage, instead of simply determining the voltage Vout of the power supply line DCL1 and causing the second switcher 180 to enter the OFF state. This is because, if the second switcher 180 is caused to enter the OFF state when the first switcher 160 is in the OFF state, both of the switchers enter the OFF state. In this case, the second switching unit 170 confirms the ON/OFF state of the first switcher 160 via the signal line Sk, and causes the second switcher 180 to enter the OFF state only when the first switcher 160 is in the ON state.

When the fourth threshold voltage (for example, 2.8 V) is higher than the second threshold voltage (for example, 2.7 V), the second switching unit 170 may simply consider only the voltage Vout of the power supply line DCL1 since the voltage Vout of the power supply line DCL1 does not become the fourth threshold voltage when the first switcher 160 is in the OFF state.

The second switcher 180 is arranged between the power supply line DCL1 and the second storage battery 140, and turns ON or OFF the power supply line DCL1 and the second storage battery 140 according to instruction content of the control signal CNT2 which is input from the second switching unit 170. The second switcher 180 enters a connected state in the ON state and connects the second storage battery 140 to the power supply line DCL1.

Further, the second switcher 180 enters an open state in the OFF state and disconnects the second storage battery 140 from the power supply line DCL1. In the following description, the connected state of the second switcher 180 is described as an ON state, and the open state of the second switcher 180 is described as an OFF state.

Further, one terminal b (a first terminal) of the second switcher 180 is connected to a node Nb of the power supply line DCL1, and is connected to a terminal a via the node Nb. The other terminal b (a second terminal) is connected to a positive electrode (+) terminal of the second storage battery 140. When the second switcher 180 is in the ON state and the first switcher 160 is in an OFF state, the voltage Vb of the positive electrode (+) terminal of the second storage battery 140 (the charging voltage Vb of the second storage battery 140) is output as the output voltage Vout to the power supply line DCL1. Further, when both of the first switcher 160 and the second switcher 180 are in the ON state, the charging voltage Va of the first storage battery 130 and the charging voltage Vb of the second storage battery 140 become the same voltage (Va=Vb).

In the following description, "the voltage Vb of the positive electrode (+) terminal of the second storage battery 140" or "the charging voltage Vb of the second storage battery 140" may be simply referred to as "the voltage Vb of the second storage battery 140".

The first switcher 160 and the second switcher 180 are controlled so that at least one of the first switcher 160 and the second switcher 180 is in the ON state at all times, and the first switcher 160 and the second switcher 180 are not in the OFF state at the same time.

Although the first switcher 160 and the second switcher 180 are configured with a mechanical contact in the example shown in FIG. 2, the first switcher 160 and the second switcher 180 include a semiconductor switch using a semiconductor switching element such as a metal oxide semiconductor field effect transistor (MOSFET) or an insulated gate bipolar transistor (IGBT).

Next, an operation of the power storage system 100 will be described.

When the solar battery 110 does not perform the power generation or when the generated power amount of the solar battery 110 is smaller than a power consumption amount of the load device 200, the power storage system 100 drives the load device 200 with the power (charge) stored in the first storage battery 130. The power storage system 100 is configured to continuously drive the load device 200 with the power stored in the first storage battery 130, for example, for approximately 60 hours. Further, the power storage system 100 is configured to cause the operation of the load device 200 to return in approximately 10 minutes after the power generation of the solar battery 110 is started again when the operation of the load device 200 is temporarily stopped due to a decrease in the charging voltage Va of the first storage battery 130 in a state in which the supply of power stops from the solar battery 110.

Further, the power storage system 100 is configured to be able to cause the operation of the load device 200 to return in a short amount of time according to the generated power amount of the solar battery 110, not only when the generated power amount of the solar battery 110 increases after the operation of the load device 200 temporarily stops due to a decrease in the charging voltage Va of the first storage battery 130 when the generated power amount of the solar battery 110 is smaller than the power consumption amount of the load device 200, but also when the state in which the generated power amount of the solar battery 110 is small continues.

In this disclosure, a case in which the solar battery 110 is in a power generation state, including a "case in which the solar battery 110 stops power generation, and the solar battery 110 starts the power generation again after the load device 200 stops the operation" or a "case in which the generated power amount of the solar battery 110 increases or a state in which the generated power amount is a small continues after the load device 200 stops the operation as the generated power amount of the solar battery 110 is smaller than the power consumption amount of the load device 200," may be simply referred to as a "case in which the solar battery 110 performs power generation."

In the power storage system 100, in view of prevention of deterioration of cells of the lithium ion capacitor of the first storage battery 130, the charging voltage Va of the first storage battery 130 is prevented from having a voltage lower than 2.5 V (the first threshold voltage) so that over-discharge is prevented. Therefore, the power storage system 100 stops the supply of power from the first storage battery 130 to the load device 200 when the charging voltage of the first storage battery 130 is a voltage close to an over-discharge state of 2.5 V. For example, the load device 200 stops its own operation when a power supply voltage supplied from the power storage system 100 becomes equal to or lower than 2.5 V.

Here, when only the first storage battery 130 is recharged to a predetermined voltage and the operation of the load device 200 is caused to return by the first storage battery 130, it is necessary to consider the following points.

For example, it is necessary to prevent a repetitive operation of recharging of the first storage battery 130 by the solar battery 110, the return of the operation of the load device 200, a reduction in the charging voltage Va of the first storage battery 130 due to re-startup of the load device 200, and stop of the operation of the load device 200 due to a decrease in the charging voltage Va from being performed. Therefore, in the power storage system 100, a voltage at which the supply of power to the load device 200 starts is set to, for example, 2.7 V (the second threshold voltage). Further, accordingly, the load device 200 itself returns to the operation with the power supply voltage of 2.7 V or more.

However, in the power storage system 100, since a charging current that can be supplied from the solar battery 110 that is an environmental power generator to the first storage battery 130 is as low as tens of μA, a long charging time such as several hours is required when the first storage battery 130 with capacitance of 40 F is charged from 2.5 V to 2.7 V. Therefore, there is a problem in that that the operation of the load device 200 stops for several hours at the time of recharging of the first storage battery 130.

Therefore, in the power storage system 100 of this embodiment, the second storage battery 140, and the first switcher 160 and the second switcher 180 serving as switching mechanisms are used together with the first storage battery 130. The power storage system 100 causes the first switcher 160 to enter the ON state (a connected state) in a state in which a lithium ion capacitor of the first storage battery 130 is in a normal state, such that the first storage battery 130 performs charging or discharging. The power storage system 100 causes the second switcher 180 to enter the ON state (a connected state) when the charging voltage Va of the first storage battery 130 decreases to a voltage slightly higher than 2.5 V (the first threshold voltage) close to an over-discharge state, such as 2.6 V (the third threshold voltage). Accordingly, the first storage battery 130 is connected in parallel with the second storage battery 140, the second storage battery 140 is charged with the charge stored in the first storage battery 130, and the charging voltage Va of the first storage battery 130 and the charging voltage Vb of the second storage battery 140 become the same potential (for example, approximately 2.54 V).

In the following description, when the first storage battery 130 is connected in parallel with the second storage battery 140, that is, when the voltage Va charged in the first storage battery 130 and the voltage Vb charged in the second storage battery 140 are the same voltage (Va=Vb), the charging voltage of the parallel circuit of the first storage battery 130 and the second storage battery 140 may be described as "voltages Va and Vb of the parallel circuit of the storage batteries".

When the solar battery 110 does not perform power generation or when the generated power amount of the solar battery 110 is smaller than the power consumption amount of the load device 200, the voltages Va and Vb of the parallel circuit of the storage batteries of the first storage battery 130 and the second storage battery 140 gradually decrease due to a periodical operation of the load device 200. When the charging voltage of the first storage battery 130 decreases to 2.5 V, the load device 200 stops the operation of the load device 200, and the supply of power from the power storage system 100 to the load device 200 is stopped.

Further, in the power storage system 100, when the voltages Va and Vb of the parallel circuit of the storage batteries decrease to 2.5 V, the first switching unit 150 causes the first switcher 160 to enter the OFF state (an open state). The second switching unit 170 maintains the ON state of the second switcher 180 as it is. Accordingly, the first storage battery 130 is disconnected from the power supply line DCL1, and only the second storage battery 140 is connected to the power supply line DCL1.

Thereafter, when light begins to hit the solar battery 110 or when a state in which the generated power amount of the solar battery 110 is small continues after the charging voltage of the first storage battery 130 decreases to 2.5 V due to a decrease in the generated power amount of the solar battery 110, the solar battery 110 flows a charging current only in the second storage battery 140. In this case, the second storage battery 140 is precharged to approximately 2.5 V with the first storage battery 130. Further, since the capacitance (1 F) of the second storage battery 140 is much smaller than the capacitance (40 F) of the first storage battery 130, the second storage battery 140 is charged by a charging current from the solar battery 110 and the charging voltage Vb rapidly increases. Therefore, the charging voltage Vb of the second storage battery 140 can reach a voltage of 2.7 V necessary to cause the operation of the load device 200 to return in a short amount of time (for example, approximately 10 minutes). Accordingly, the power storage system 100 can restart the load device 200 in a short amount of time when the solar battery 110 performs power generation after the operation of the load device 200 stops.

Thus, the power storage system 100 of this embodiment can rapidly increase the output voltage Vout that is supplied to the load device 200 even when the first storage battery 130 with large capacitance is used. Therefore, in the power storage system 100, when the solar battery 110 performs the power generation after the operation of the load device 200 temporarily stops due to a decrease in the voltage Va of the first storage battery 130, it is possible to cause the operation of the load device 200 to return in a short amount of time.

When the state in which a generated power amount of the solar battery 110 is small continues, the load device 200 operates for a certain amount of time, and then eventually, the charging voltage Va of the first storage battery 130 decreases to be equal to or lower than 2.5 V, and the operation of the load device 200 stops again. That is, in a state in which a generated power amount of the solar battery 110 is small, the operation stop and the operation return of the load device 200 are repeated. However, the load device 200 can continue to perform the measurement and communication operations for a certain amount of time at the time of the operation return of the load device 200.

In the power storage system 100, when the first switcher 160 is in the ON state and the second switcher 180 is in an OFF state, the power generated by the solar battery 110 is supplied to the first storage battery 130 via the DC/DC converter 115, and the power is supplied from the first storage battery 130 to the load device 200.

Further, when the first switcher 160 and the second switcher 180 are in the ON state, the power storage system 100 supplies the power generated by the solar battery 110 to the first storage battery 130 and the second storage battery 140, and supplies the power to the load device 200 using the first storage battery 130 and the second storage battery 140. Further, in the power storage system 100, when the second switcher 180 is in the ON state and the first switcher 160 is in the OFF state, the power generated by the solar battery 110 is supplied to the second storage battery 140.

Further, in the power storage system 100 described above, although the first threshold voltage is set to 2.5 V, this voltage may have a value of a voltage at which the lithium ion capacitor is not over-discharged or higher. For example, if a voltage at which the voltage lithium ion capacitor enters an over-discharged state is 2.2 V, the first threshold voltage may be a voltage exceeding 2.2 V such as 2.3 V.

Further, in the power storage system 100, the second threshold voltage is set to 2.7 V so that the charging voltage of the second storage battery 140 is 0.2 V, but the second threshold voltage is not limited thereto and may, for example, be 2.6 V. Further, the capacitance of the second storage battery 140 may be changed according to the second threshold voltage. For example, in the power storage system 100, when the second threshold voltage is set to 2.6 V, the capacitance of the second storage battery 140 is 2 F so that the same amount of charge as in the case in which the second threshold voltage is 2.7 V can be stored.

Further, although the third threshold voltage is 2.6 V, the load device 200 can appropriately set the third threshold voltage according to the first threshold voltage.

In this case, the third threshold voltage is set so that the voltage Va of the first storage battery 130 does not become equal to or lower than 2.5 V (the first threshold voltage) at a moment at which the second switcher 180 enters the ON state even when the voltage Vb of the second storage battery 140 is 0 V.

That is, the third threshold voltage is set so that "charge amount of the first storage battery at the third threshold voltage is greater than (charge amount of the first storage battery at the first threshold voltage+charge amount of the second storage battery at the first threshold voltage)." That is, it is preferable for the third threshold voltage to be set so that the first storage battery 130 has the third threshold voltage, and the voltage of the parallel circuit in which the first storage battery 130 is connected in parallel with the second storage battery 140 immediately after the second switcher 180 enters the ON state becomes equal to or higher than 2.5 V (the first threshold voltage).

Further, 2.8 V (the fourth threshold voltage) that is a determination voltage when the second storage battery 140 is disconnected from the first storage battery 130 is not limited thereto and can be a desired voltage exceeding 2.7 V.

Further, the second switching unit 170 may switch the second switcher 180 from the ON state to the OFF state and disconnect the second storage battery 140 from the first storage battery 130 immediately after the second switching unit 170 switches the first switcher 160 from the OFF state to the ON state, that is, immediately after charging from the second storage battery 140 to the first storage battery 130 is performed.

In this case, the second switching unit 170, for example, sets its own "reference voltage Ref4" to the same voltage as the "reference voltage Ref4 of the first switching unit 150" so that the "a second threshold voltage equals the fourth threshold voltage". Accordingly, the second switching unit 170 can switch the second switcher 180 from the ON state to the OFF state immediately after the first switcher 160 is switched from the OFF state to the ON state.

It is necessary for a timing at which the second switching unit 170 causes the second switcher 180 to enter the OFF state to be after the first switcher 160 is turned ON and charging from the second storage battery 140 to the first storage battery 130 is completed. Therefore, the second switching unit 170, for example, determines that the voltage Vb of the second storage battery 140 is the fourth threshold voltage (equal to the second threshold voltage), and then causes the second switcher 180 to enter the OFF state with a predetermined delay time (for example, several 10 msec).

Alternatively, the second switching unit 170 does not provide its own "reference voltage Ref4" (does not determine the fourth threshold voltage) and may receive information on the open or closed state of the first switcher 160 from the first switching unit 150 via the signal line Sk, determine that the first switcher 160 is switched from the OFF state to the ON state, and cause the second switcher 180 to enter the OFF state.

Figure 5:
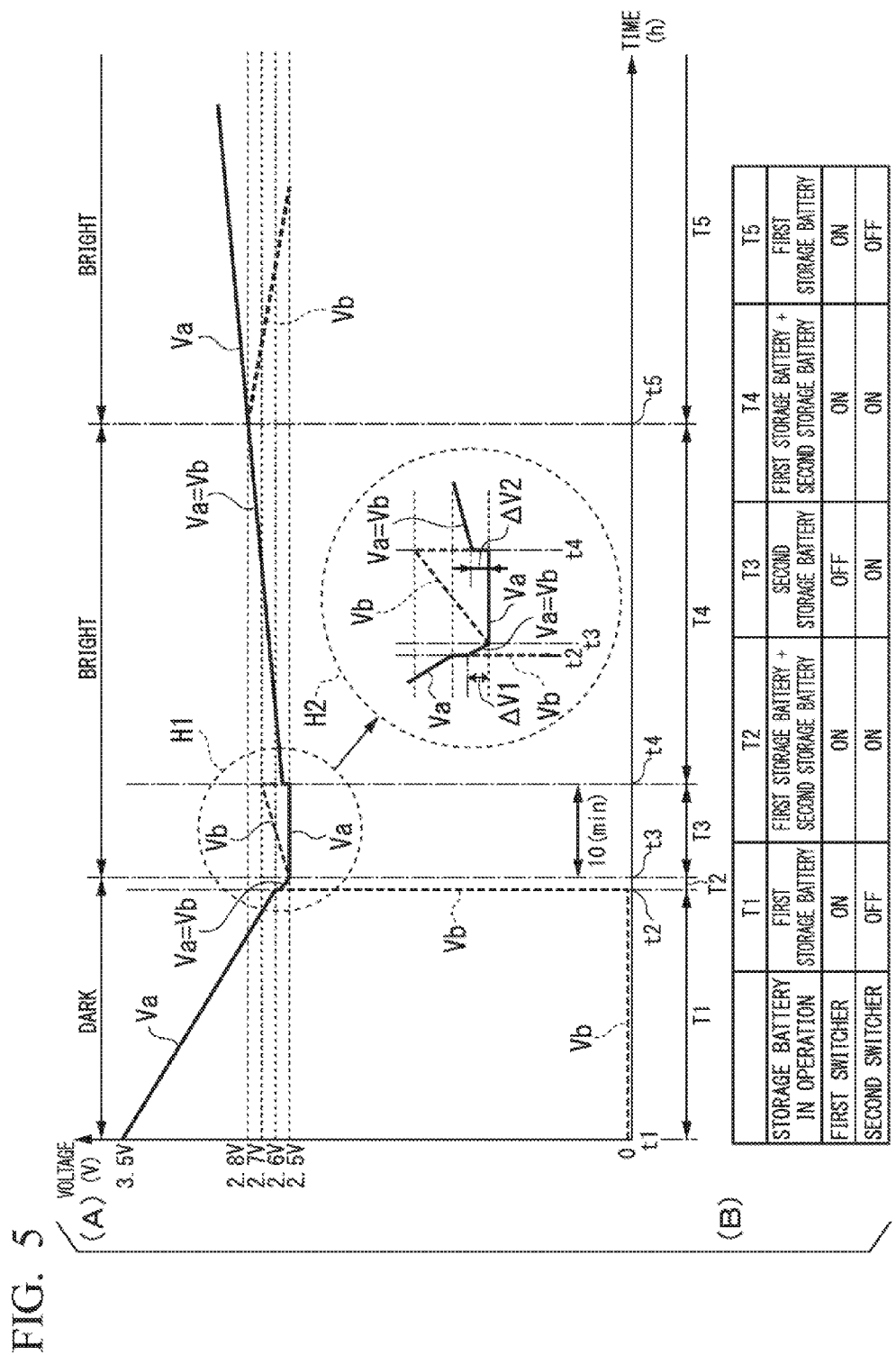
FIG. 5 is an image diagram showing an operation when the power storage system according to the first embodiment returns to a normal state again after the power storage system transitions from the normal state to a state of a voltage close to an over-discharge state.
Figure 6A:
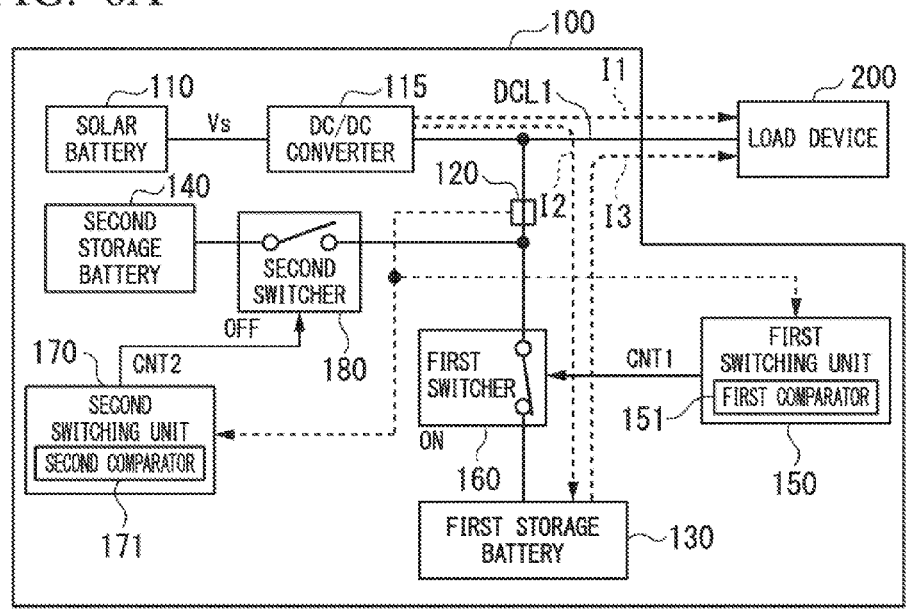
FIG. 6A is an illustrative diagram showing a power supply state in the normal state of the power storage system according to the first embodiment
Figure 6B:
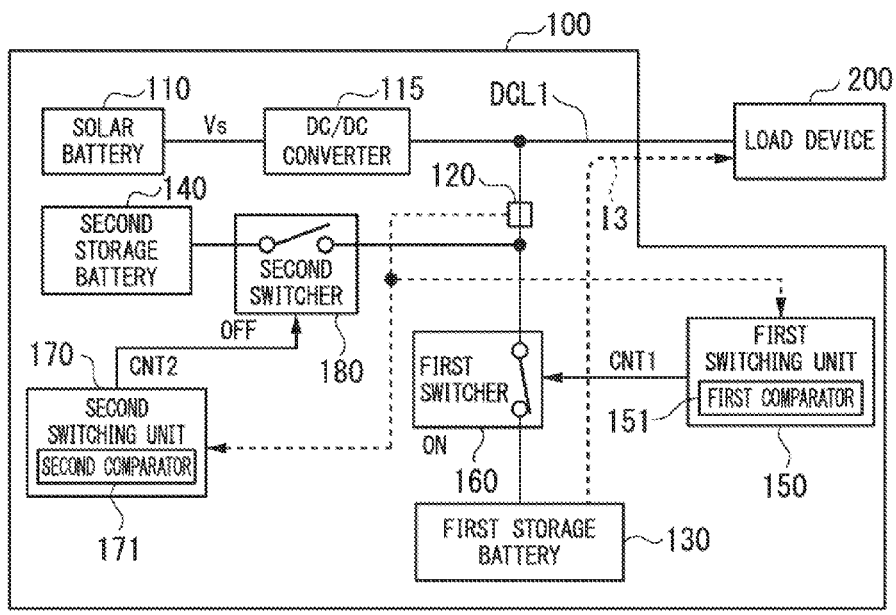
FIG. 6B is an illustrative diagram showing a power supply state in the normal state of the power storage system according to the first embodiment
Figure 7A:
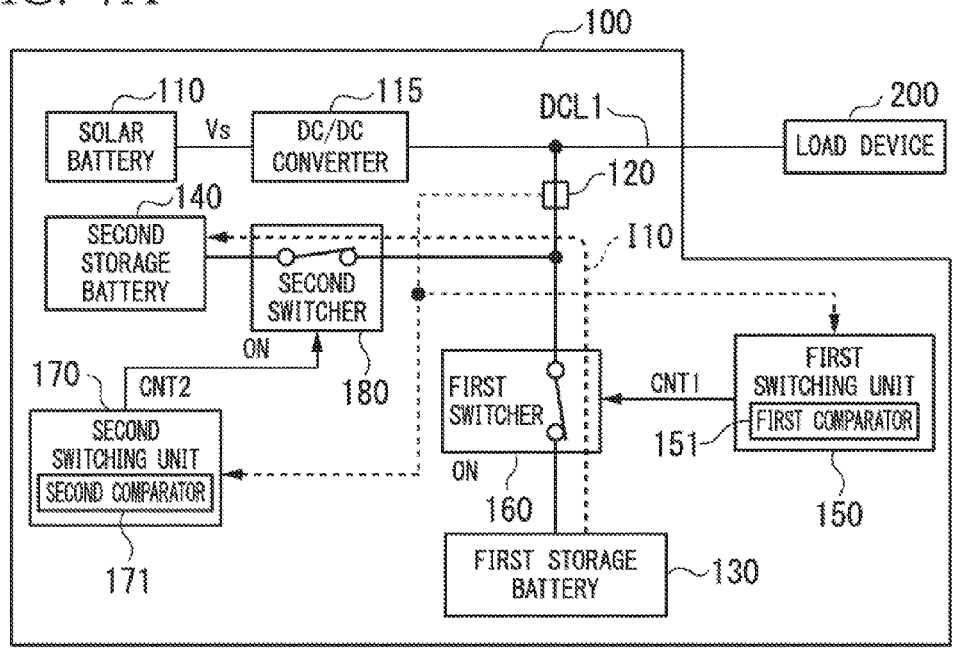
FIG. 7A is an illustrative diagram showing a state of supply of the voltage close to the over-discharge state of the power storage system according to the first embodiment
Figure 7B:
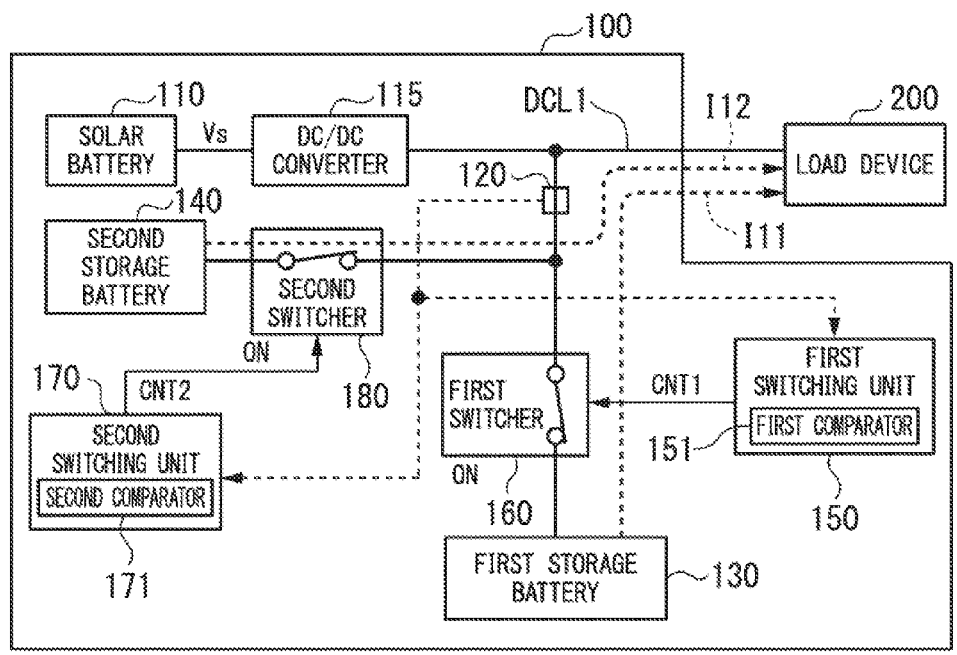
FIG. 7B is an illustrative diagram showing a state of supply of the voltage close to the over-discharge state of the power storage system according to the first embodiment
Figure 8A:
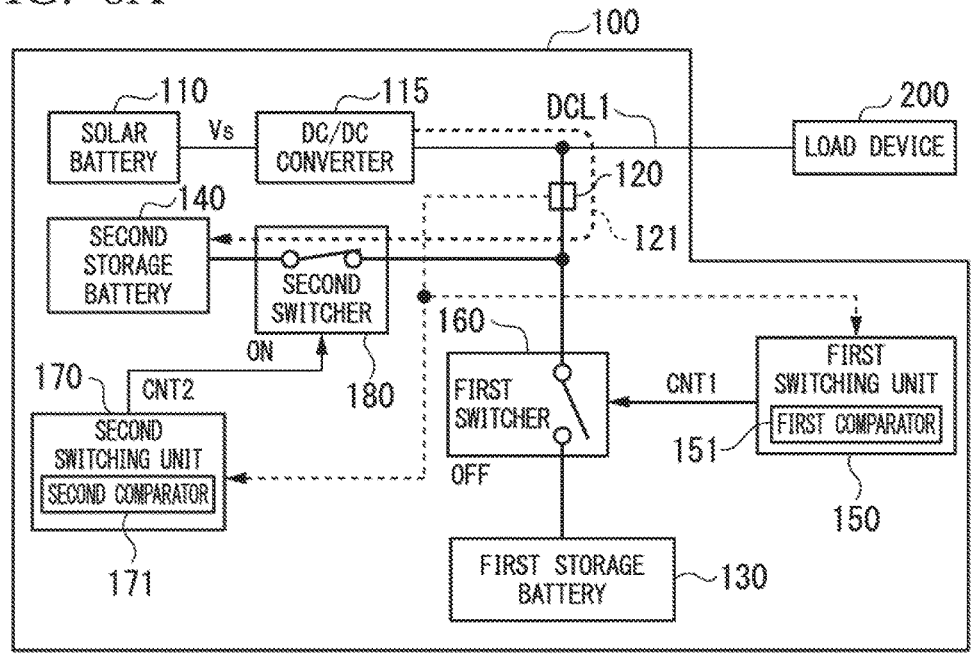
FIG. 8A is an illustrative diagram showing a power supply state in an operation in which the power storage system according to the first embodiment returns to the normal state.
Figure 8B:
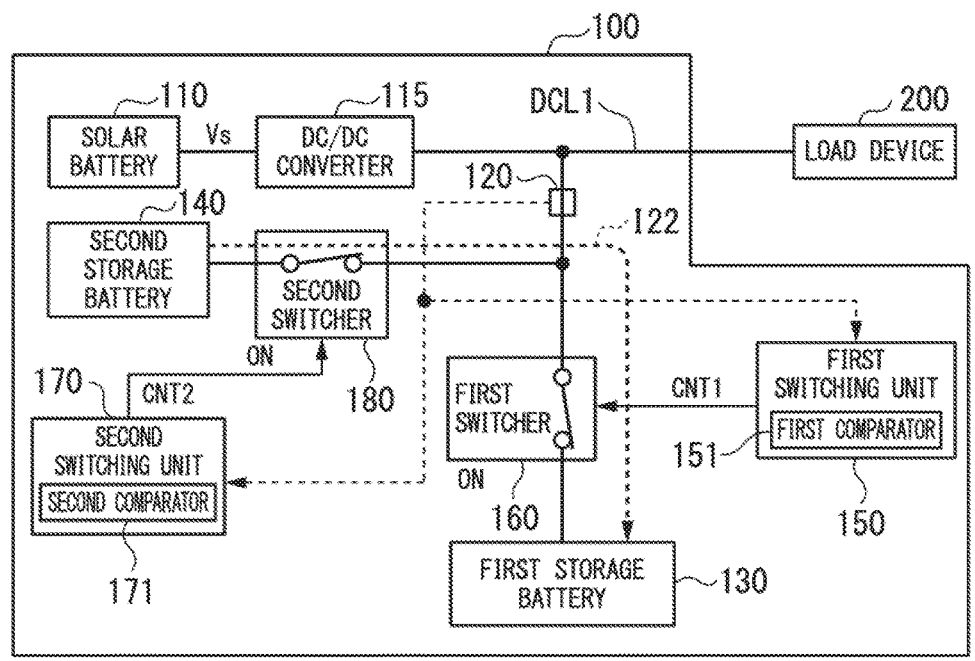
FIG. 8B is an illustrative diagram showing a power supply state in an operation in which the power storage system according to the first embodiment returns to the normal state.

FIG. 5 is an image diagram showing an operation when the power storage system 100 according to this embodiment returns to a normal state again after the power storage system 100 transitions from the normal state to the state of the voltage close to the over-discharge state. Further, FIGS. 6A and 6B are illustrative diagrams showing a power supply state in the normal state of the power storage system 100 according to this embodiment. FIGS. 7A and 7B are illustrative diagrams showing a state of supply of the voltage close to the over-discharge state of the power storage system 100 according to this embodiment. FIGS. 8A and 8B are illustrative diagrams showing a power supply state in an operation in which the power storage system 100 according to this embodiment returns to the normal state.

An operation in which the power storage system 100 the first storage battery 130 enters the state of the voltage close to the over-discharge state in a state in which the solar battery 110 stops power generation, the solar battery 110 starts power generation again after the load device 200 stops the operation, and the power storage system 100 returns to the normal state will be described with reference to FIGS. 5 to 8B.

In FIG. 5, PART (A) of FIG. 5 shows a change in the voltage Va of the first storage battery 130 and a change in the voltage Vb of the second storage battery 140 in a conceptual image, in which a vertical axis indicates a voltage (V) and a horizontal axis indicates an elapsed time (h: hours). Further, PART (B) of FIG. 5 shows, in a table, a change in the storage battery in an operation involved in a charging or discharging operation, an ON or OFF state of the first switcher 160, and an ON or OFF state of the second switcher 180 in respective periods T1 to T5 shown in PART (A) of FIG. 5.

In PART (A) of FIG. 5, a period indicated by "bright" refers to a time zone in which an interior of an office is bright due to illumination or external light, and a period indicated by "dark" refers to a time zone in which the interior of the office is dark at night or because the illumination is off. Further, in PART (A) of FIG. 5, a period from the time t1 to the time t2 after the time t1 is indicated as a period T1, a period from the time t2 to the time t3 after the time t2 is indicated as a period T2, a period from the time t3 to the time t4 after the time t3 is indicated as a period T3, a period from the time t4 to a time t5 after the time t4 is indicated as a period T4, and a period after the time t5 is indicated as a period T5.

Further, in PART (A) of FIG. 5, since it is difficult to view a waveform of a portion of an area H1 indicated by a mark "○" of a dashed line (a circle indicated by a dashed line), the waveform of the portion of this area H1 is enlarged twofold in a vertical axis direction and shown in an area H2 indicated by a mark "○" of the same dashed line (a circle indicated by a dashed line).

In FIG. 5, at the time t1, the power storage system 100 operates in a normal state. That is, at the time t1, the voltage Va of the first storage battery 130 is approximately 3.5 V, the first switcher 160 is in the ON state, and the second switcher 180 is in the OFF state.

In the normal state of the power storage system 100, for example, as shown in FIG. 6A, when the power generated by the solar battery 110 is sufficiently high, for example, when the output voltage of the DC/DC converter 115 that performs voltage conversion of the output voltage Vs of the solar battery 110 is 3.5 V or the like, the DC/DC converter 115 flows a current I1 in the load device 200 to supply the power, and supplies a charging current I2 in the first storage battery 130 via the first switcher 160. Further, for the power to be consumed in the load device 200, when the current I1 flowing from the DC/DC converter 115 to the load device 200 is insufficient, the first storage battery 130 flows a current I3 in the load device 200 via the first switcher 160 to supply the power.

On the other hand, as shown in FIG. 6B, when the solar battery 110 does not perform power generation and the power is not supplied from the DC/DC converter 115, the first storage battery 130 flows the current I3 in the load device 200 via the first switcher 160 to supply the power.

FIG. 5 will be referred to again. In FIG. 5, in a "dark" period T1 that continues from the time t1 to the time t2, the first switcher 160 is in the ON state, and the second switcher 180 is in the OFF state. In the period T1, the solar battery 110 does not supply the power to the first storage battery 130, and the load device 200 operates periodically. Therefore, the first storage battery 130 supplies a current I3 to the load device 200, as shown in FIG. 6B. Accordingly, the voltage Va of the first storage battery 130 decreases gradually due to the periodical operation of the load device 200. On the other hand, the voltage Vb of the second storage battery 140 is not charged from the solar battery 110 and is substantially 0 V since the second switcher 180 is in the OFF state.

At a time t2, if the voltage Va of the first storage battery 130 decreases to 2.6 V (the third threshold voltage), the power storage system 100 enters the period T2 that is in the state of the voltage close to the over-discharge state. Further, the period T2 is a time zone of "dark".

In this period T2, the second switching unit 170 switches the second switcher 180 from the OFF state to the ON state, and the first switching unit 150 maintains the ON state of the first switcher 160 as it is. Accordingly, at the time t2, the first storage battery 130 is connected in parallel with the second storage battery 140, and the second storage battery 140 is charged with the charges stored in the first storage battery 130. That is, redistribution of charge is performed between the first storage battery 130 and the second storage battery 140, and the voltage Va of the first storage battery 130 and the voltage Vb of the second storage battery 140 instantaneously become the same voltage "2.5 V+ΔV1 (approximately 0.04 V)."

For example, as shown in FIG. 7A, since the second switcher 180 enters the ON state, a charging current I10 flows from the first storage battery 130 to the second storage battery 140, and the voltage Va of the first storage battery 130 and the voltage Vb of the second storage battery 140 instantaneously become the same voltage.

In the period T2, since the first switcher 160 and the second switcher 180 are in an ON state, the voltage Va of the first storage battery 130 and the voltage Vb of the second storage battery 140 become the same voltage (Va=Vb), and power is supplied from both of the first storage battery 130 and the second storage battery 140 to the load device 200. In the period T2, the solar battery 110 does not perform the supply of power to the first storage battery 130 and the second storage battery 140, and the load device 200 operates periodically. Therefore, as shown in FIG. 7B, the first storage battery 130 supplies a current I11 to the load device 200 via the first switcher 160, and the second storage battery 140 supplies a current I12 to the load device 200 via the second switcher 180. Accordingly, the voltages Va and Vb of the parallel circuit of the storage batteries of the first storage battery 130 and the second storage battery 140 gradually decrease.

At a time t3, since the voltages Va and Vb of the parallel circuit of the storage batteries decrease to 2.5 V (the first threshold voltage), the first storage battery 130 enters a state of a voltage close to the over-discharge state. Since the voltages Va and Vb of the parallel circuit of the storage batteries decrease to 2.5 V, the output voltage Vout of the power supply line DCL1 decreases to 2.5 V, the load device 200 itself determines that the output voltage Vout of the power supply line DCL1 decreases to 2.5 V or lower, and the load device 200 itself stops the operation. Accordingly, the power storage system 100 stops the supply of power to the load device 200. Further, in the state of the voltage close to the over-discharge state, the first switching unit 150 switches the first switcher 160 from the ON state to the OFF state, and the second switching unit 170 maintains the ON state of the second switcher 180 as it is. Accordingly, the first storage battery 130 is disconnected from the power supply line DCL1.

Immediately after the time t3, the period T3 of "bright" starts and the solar battery 110 starts a power generation device again. In this period T3, the first switcher 160 is in the OFF state, the second switcher 180 is in the ON state, and the load device 200 has stopped operation.

Therefore, from this time t3, the solar battery 110 supplies the charging current I21 only to the second storage battery 140, as shown in FIG. 8A. Further, the second storage battery 140 is charged to approximately 2.5 V in advance at the time of start of charging from the solar battery 110.

Further, since the capacitance (1 F) of the second storage battery 140 is much smaller than the capacitance (40 F) of the first storage battery 130, the second storage battery 140 is charged by the charging current I21 from the solar battery 110 and the charging voltage Vb rapidly increases.

That is, when charging is performed from the solar battery 110 to the second storage battery 140 with small capacitance (1 F), the voltage Vb of the second storage battery 140 increases at a speed of 40 times the speed at which charging is performed from the solar battery 110 to the first storage battery 130 with large capacitance (40 F).

Accordingly, the voltage Vb of the second storage battery 140 starts from the voltage of 2.5 V at the time of the start of charging and increases to a voltage of 2.7 V after 10 minutes (min) from the start of charging. The voltage Vb of the second storage battery 140 is output to the load device 200 as the output voltage Vout of the power supply line DCL1. On the other hand, the voltage Va of the first storage battery 130 is maintained at 2.5 V since the first switcher 160 is in the OFF state.

At a time t4, the voltage Vb of the second storage battery 140 reaches 2.7 V. The load device 200 itself determines that the output voltage Vout supplied from the power supply line DCL1 (in this case, the voltage Vb of the second storage battery 140) reaches 2.7 V, returns to the operation, and resumes the measurement and communication operations. After the load device 200 returns to the operation, the first switching unit 150 switches the first switcher 160 from the OFF state to the ON state to connect the first storage battery 130 in parallel with the second storage battery 140. Accordingly, as shown in FIG. 8B, a charging current I22 flows from the second storage battery 140 to the first storage battery 130, and the voltage Va of the first storage battery 130 and the voltage Vb of the second storage battery 140 instantaneously become the same voltage "2.5 V+ΔV2 (for example, approximately 0.005 V)." Even when the voltage Vout of the power supply line DCL1 decreases from 2.7 V to "2.5 V+ΔV2", the load device 200 continues to operate as it is since the output voltage Vout exceeds 2.5 V.

After the load device 200 returns to the operation, a timing at which the first switching unit 150 switches the first switcher 160 to the ON state may be after the load device 200 has repeated the measurement and communication operations several times. For example, after the load device 200 repeats the measurement and communication operations three times at five-minute intervals, the first switching unit 150 may switch the first switcher 160 from the OFF state to the ON state.

Further, when the load device 200 itself determines that the output voltage Vout supplied from the power supply line DCL1 (in this case, the voltage Vb of the second storage battery 140) has reached 2.7 V, the load device 200 may start the operation after a predetermined time has elapsed instead of immediately starting the operation. That is, the load device 200 may start the operation at a point in time at which some time has elapsed after the first switcher 160 is first switched to the ON state.

In the period T4 after the time t4, the first switcher 160 and the second switcher 180 are both turned ON, the first storage battery 130 is connected in parallel to the second storage battery 140, and the voltage Va of the first storage battery 130 and the voltage Vb of the second storage battery 140 become the same voltage (Va=Vb). Charging is performed from the solar battery 110 to the parallel circuit of the first storage battery 130 and the second storage battery 140. Accordingly, the voltages Va and Vb of the parallel circuit of the storage batteries increase gradually.

At the time t5, if the voltages Va and Vb of the parallel circuit of the storage batteries reach the voltage of 2.8 V (the fourth threshold voltage), the second switching unit 170 switches the second switcher 180 from the ON state to the OFF state. On the other hand, the first switching unit 150 maintains the ON state of the first switcher 160 as it is. Accordingly, in the period T5 after the time t5, the second storage battery 140 is disconnected from the power supply line DCL1, and then, the voltage Vb of the second storage battery 140 gradually decreases due to a leakage current. On the other hand, since the charging from the solar battery 110 continues, the second storage battery 140 the voltage Va of the first storage battery 130 further increases after the time t5.

Accordingly, the power storage system 100 can cause the operation of the load device 200 that has temporarily stopped due to the first storage battery 130 with large capacitance entering the state of the voltage close to the over-discharge state to return in a short amount of time after the solar battery 110 starts the power generation.

Figure 9:
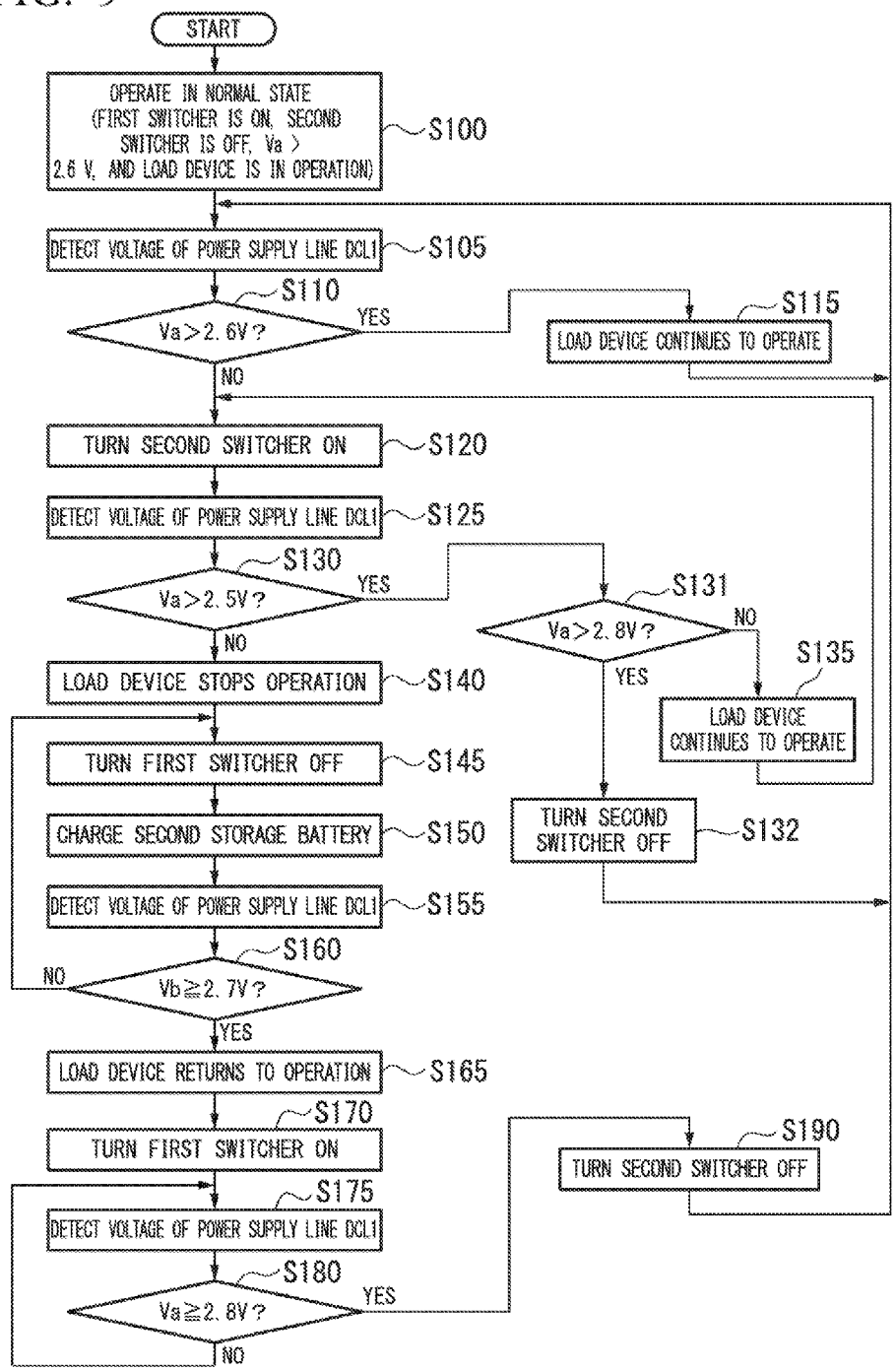
FIG. 9 is a flowchart showing a procedure of a process in the power storage system according to the first embodiment.

FIG. 9 is a flowchart showing a processing procedure in the power storage system 100 according to the first embodiment. Hereinafter, a flow of the process will be described with reference to FIG. 9.

First, the power storage system 100 operates in a normal state (step S100).

That is, in the power storage system 100, the first switcher 160 is in the ON state, the second switcher 180 is in an OFF state, and the voltage Va of the first storage battery 130 exceeds 2.6 V, and the load device 200 is in operation. That is, in the power storage system 100, the first storage battery 130 is connected to the power supply line DCL1, the second storage battery 140 is disconnected from the power supply line DCL1, and only the first storage battery 130 performs a charging or discharging operation.

Then, the voltage determiner 120 determines the output voltage Vout of the power supply line DCL1 (in this case, the voltage Va of the first storage battery 130) and outputs the voltage determination signal Vf to the first switching unit 150 and the second switching unit 170 (step S105).

Subsequently, the second switching unit 170 determines whether or not the voltage Va of the first storage battery 130 exceeds 2.6 V (the third threshold voltage) by comparing the voltage determination signal Vf with the predetermined reference voltage Ref3 (step S110).

When the voltage Va of the first storage battery 130 is determined to exceed 2.6 V (the third threshold voltage) in step S110 (step S110: Yes), the load device 200 continues to operate (step S115) and the power storage system 100 returns to the process of step S105. Subsequently, the power storage system 100 executes step S105 and subsequent processes again.

On the other hand, when the voltage Va of the first storage battery 130 is determined not to exceed 2.6 V (the third threshold voltage) in step S110 (step S110: No), that is, when the voltage Va of the first storage battery 130 becomes equal to or lower than 2.6 V, the second switching unit 170 causes the second switcher 180 to enter the ON state (step S120). Since the second switcher 180 enters the ON state, the first storage battery 130 and the second storage battery 140 are connected in parallel, and the second storage battery 140 is charged by the charge stored in the first storage battery 130. Accordingly, the voltage Va of the first storage battery 130 and the voltage Vb of the second storage battery 140 become the same voltage (Va=Vb).

Subsequently, the voltage determiner 120 determines the output voltage Vout of the power supply line DCL1 (in this case, the voltages Va and Vb of the parallel circuit of the storage batteries of the first storage battery 130 and the second storage battery 140) and outputs the voltage determination signal Vf to the first switching unit 150 and the second switching unit 170 (step S125).

Subsequently, the first switching unit 150 compares the voltage determination signal Vf with a predetermined reference voltage Ref1 to determine whether the voltage Va of the first storage battery 130 exceeds 2.5 V (the third threshold voltage) (step S130).

When it is determined in step S130 that the voltage Va of the first storage battery 130 exceeds 2.5 V (the first threshold voltage) (step S130: Yes), the second switching unit 170 determines whether or not the output voltage Vout of the power supply line DCL1 (in this case, the voltage Va of the first storage battery 130) exceeds 2.8 V (the fourth threshold voltage) (step S131).

When it is determined in step S131 that the voltage of the voltage Va of the first storage battery 130 exceeds 2.8 V (step S131: Yes), the second switching unit 170 switches the second switcher 180 from the ON state to the OFF state (step S132), and then, returns to the process of step S105.

On the other hand, when it is determined in step S131 that the voltage of the voltage Va of the first storage battery 130 does not exceed 2.8 V (step S131: No), the load device 200 just continues to operate (step S135) and the power storage system 100 returns to the process of step S120. Subsequently, the power storage system 100 repeatedly executes step S105 and subsequent processes.

On the other hand, when it is determined in step S130 that the voltages Va and Vb of the parallel circuit of the storage batteries do not exceed 2.5 V (the first threshold voltage) (step S130: No), that is, when the voltages Va and Vb of the parallel circuit of the storage batteries become equal to or lower than 2.5 V, the load device 200 stops the measurement and communication operations (step S140). Since the output voltage Vout of the power supply line DCL1 also becomes equal to or lower than 2.5 V when the voltages Va and Vb of the parallel circuit of the storage batteries become 2.5 V, the load device 200 itself determines that the output voltage Vout of the power supply line DCL1 becomes equal to or lower than 2.5 V and the load device 200 stop the measurement and communication operations. Accordingly, the power storage system 100 stops the supply of power to the load device 200.

Subsequently, the first switching unit 150 switches the first switcher 160 from the ON state to the OFF state and disconnects the first storage battery 130 from the power supply line DCL1 (step S145). Accordingly, the power storage system 100 transitions to a state of the voltage close to the over-discharge state of the first storage battery 130.

Subsequently, when the solar battery 110 is performing the power generation, the charging from the solar battery 110 to the second storage battery 140 is performed (step S150).

Subsequently, the voltage determiner 120 determines the voltage of the power supply line DCL1 (in this case, the voltage Vb of the second storage battery 140) and outputs the voltage determination signal Vf to the first switching unit 150 and the second switching unit 170 (step S155). The first switching unit 150 compares the voltage determination signal Vf with the predetermined reference voltage Ref2 to determine whether or not the voltage Vb of the second storage battery 140 is equal to or higher than 2.7 V (the second threshold voltage) (step S160).

When it is determined in step S160 that the voltage Vb of the second storage battery 140 is not equal to or higher than 2.7 V (the second threshold voltage) (step S160: No), the power storage system 100 returns to the process of step S130, and the first switching unit 150 maintains the OFF state of the first switcher 160 as it is (step S145). Subsequently, the power storage system 100 repeatedly executes step S150 and subsequent processes.

That is, when power generation is not performed by the solar battery 110 and charging is not performed from the solar battery 110 to the second storage battery 140 after the power storage system 100 transitions to the state of the voltage close to the over-discharge state of the first storage battery 130, the voltage Vb of the second storage battery 140 does not increase, and the process of steps S145 to S160 is repeatedly executed. Further, even when the solar battery 110 performs the power generation and charging is performed from the solar battery 110 to the second storage battery 140, the process from step S145 to S160 is repeatedly performed until the voltage Vb of the second storage battery 140 becomes equal to or higher than 2.7 V.

When the solar battery 110 performs the power generation, the voltage Vb of the second storage battery 140 increases and becomes equal to or higher than 2.7 V. When the first switching unit 150 determines that the voltage Vb of the second storage battery 140 is equal to or higher than 2.7 V (the second threshold voltage) (step S160: Yes), the operation of the load device 200 returns (step S165) and the first switching unit 150 switches the first switcher 160 from the OFF state to the ON state (step S170). Thus, the first storage battery 130 is connected in parallel with the second storage battery 140.

When the voltage Vb of the second storage battery 140 becomes equal to or higher than 2.7 V, the load device 200 itself determines that the power supply voltage supplied by the output voltage Vout of the power supply line DCL1 (in this case, the voltage Vb of the second storage battery 140) becomes equal to or higher than 2.7 V, and the operation of the load device 200 returns.

Further, the first switching unit 150 may delay a timing at which the first switching unit 150 switches the first switcher 160 from the OFF state to the ON state in step S170, by a predetermined time after the operation of the load device 200 returns. Accordingly, the second storage battery 140 can supply power at least one time when the load device 200 performs the measurement operation and the communication operation.

Subsequently, the voltage determiner 120 determines the output voltage Vout of the power supply line DCL1 (in this case, the voltages Va and Vb of the parallel circuit of the storage batteries) and outputs a voltage determination signal Vf to the first switching unit 150 and the second switching unit 170 (step S175). The second switching unit 170 compares the voltage determination signal Vf with a predetermined reference voltage Ref4 to determine whether or not the voltages Va and Vb of the parallel circuit of the storage batteries are equal to or higher than 2.8 V (the fourth threshold voltage) (step S180).

When it is determined in step S180 that the voltages Va and Vb of the parallel circuit of the storage batteries are not equal to or higher than 2.8 V (the fourth threshold voltage) (step S180: No), the power storage system 100 returns to the process of S175 and repeatedly executes step S175 and subsequent processes.

When it is determined in step S180 that the voltages Va and Vb of the parallel circuit of the storage batteries are equal to or higher than 2.8 V (the fourth threshold voltage) (step S180: Yes), the second switching unit 170 causes the second switcher 180 to enter the OFF state (step S190).

Accordingly, the second storage battery 140 is disconnected from the power supply line DCL1.

After the process of step S190 is executed, the power storage system 100 returns to the process of step S105. Accordingly, the power storage system 100 returns to an operation in the normal state in which the second storage battery 140 is disconnected from the power supply line DCL1, and starts step S105 and subsequent processes again.

Through the flow of the process, the power storage system 100 can cause the operation of the load device 200 that has temporarily stopped due to the first storage battery 130 with large capacitance entering the state of the voltage close to the over-discharge state, to return in a short amount of time when the solar battery 110 performs power generation.

Figure 10:
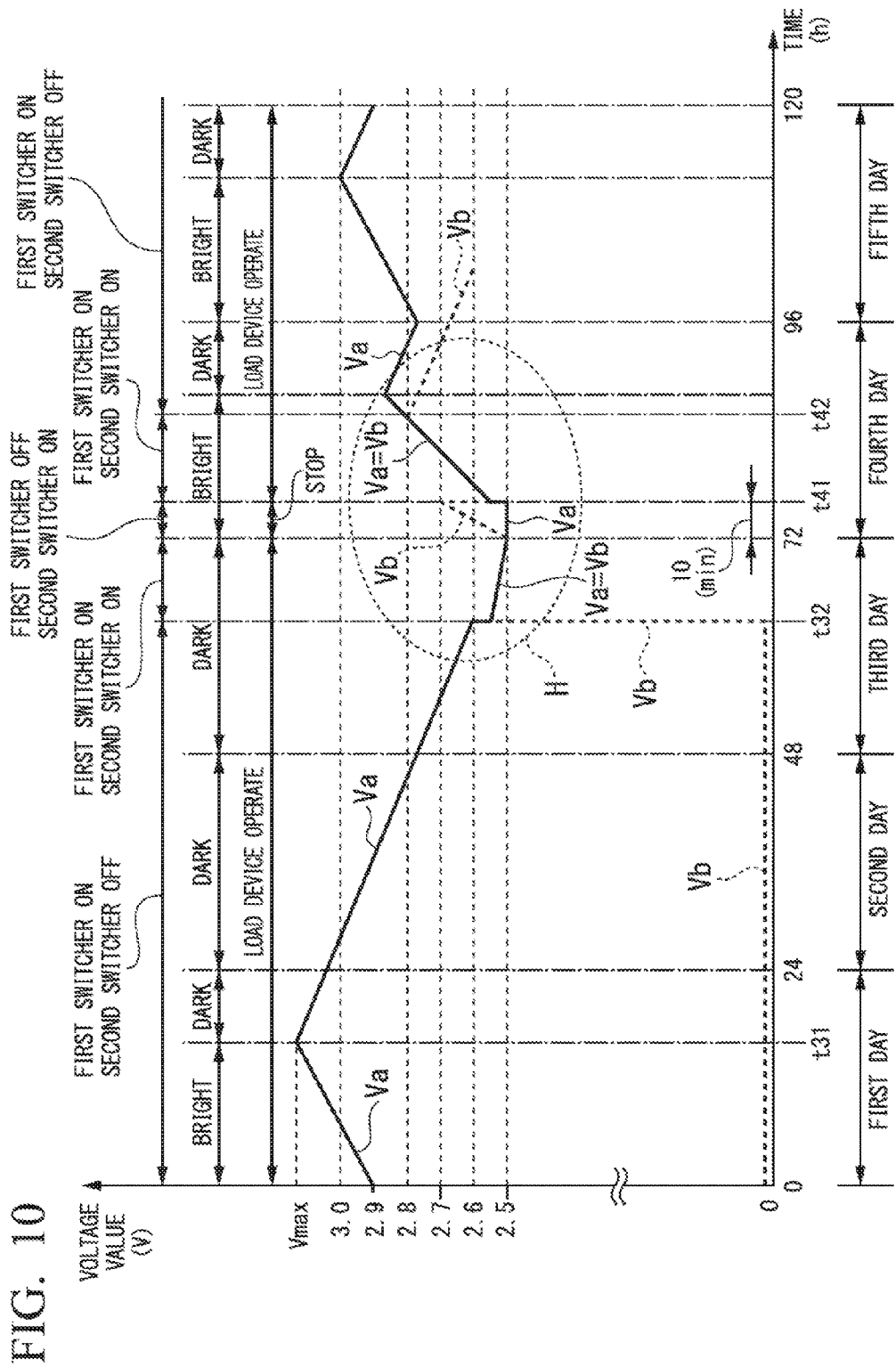
FIG. 10 is an image diagram showing an operation example of the power storage system according to the first embodiment.

FIG. 10 is an image diagram showing an operation example of the power storage system 100 according to this embodiment. In the example shown in FIG. 9, a vertical axis indicates a voltage, a horizontal axis indicates an elapsed time (h: hour), and change characteristics of the voltage Va of the first storage battery 130 and the voltage Vb of the second storage battery 140 are conceptually shown in an image.

Further, in FIG. 10, a period indicated by "bright" refers to a time zone in which an interior of an office becomes bright due to an illumination or external light, and a period indicated by "dark" refers to a time zone in which the interior of the office becomes dark at night or due to off of the illumination. Further, in FIG. 10, a portion of an area H surrounded by a dashed circle (an ellipse indicated by a dashed line) is the same waveform as in FIG. 5 described above.

In FIG. 10, a first day includes, for example, 24 hours from Friday morning 8:00 of a weekend (for example, a time at which an interior becomes bright in an office or the like) to the next day morning 8:00. A second day includes 24 hours from Saturday morning 8:00 to the next day morning 8:00. A third day includes 24 hours from Sunday morning 8:00 to the next day morning 8:00. A fourth day includes 24 hours from Monday morning 8:00 of the next week to the next day morning 8:00. A fifth day includes 24 hours from Tuesday morning 8:00 to the next day morning 8:00.

In the example shown in FIG. 10, a period "bright" and a period "dark" are repeated on a daily basis on a first day (from Friday morning 8:00 to Saturday morning 8:00), a fourth day (from Monday morning 8:00 to Tuesday morning 8:00), and a fifth day (from Tuesday morning 8:00 to Wednesday morning 8:00). On the other hand, the period "dark" continues since it is a holiday on the second day (Saturday morning 8:00 to Sunday morning 8:00) and the third day (Sunday morning 8:00 to Monday morning from 8:00).

Further, at a first point in time of the first day (elapsed time "0 hours": Friday morning 8:00), the first switcher 160 is in the ON state, the second switcher 180 is in the OFF state, and the voltage Va of the first storage battery 130 is approximately 2.9 V. Further, since the second switcher 180 is in the OFF state and the second storage battery 140 is disconnected from the power supply line DCL1, the voltage Vb of the second storage battery 140 is substantially 0 V. The voltage 2.9 V of the first storage battery 130 is supplied to the load device 200 as the output voltage Vout of the power supply line DCL1, and the load device 200 is in an operable state. That is, at the elapsed time "0 hours", the power storage system 100 is assumed to operate in a normal state in which the first storage battery 130 is not in the state of the voltage close to the over-discharge state.

At a point in time of an elapsed time "0 hours", the period "bright" in which the interior of the office becomes bright due to external light (alternatively, illumination light) begins. The period "bright" that begins at the elapsed time "0 hours" continues to an elapsed time t31 after the elapsed time "0 hours". If light hits the solar battery 110 and the power generation of the solar battery 110 starts after the elapsed time "0 hours", charging from the solar battery 110 to the first storage battery 130 starts, and the voltage Va of the first storage battery 130 begins to increase. In this case, since the first switcher 160 is in the ON state, the voltage Vout of the power supply line DCL1 becomes the voltage Va of the first storage battery 130.

In the period "bright" from elapsed time 00:00 to the elapsed time t31, the voltage Va of the first storage battery 130 gradually increases and the voltage Va of the first storage battery 130 reaches a maximum value Vmax at the time t31.

Then, the period "dark" in which the interior of the office becomes dark begins at the elapsed time t31.

The period "dark" that begins from the elapsed time t31 continues to the elapsed time "72 hours" after the elapsed time t31. From the elapsed time t31, the power generation of the solar battery 110 stops, and charging from the solar battery 110 to the first storage battery 130 stops. In the period "dark" after the elapsed time t31, the charge stored in the first storage battery 130 gradually decreases and the voltage Va of the first storage battery 130 gradually decreases as the measurement and communication operations of the load device 200 are periodically repeated. The period "dark" continues from the elapsed time t31 to the elapsed time "72 hours" of the third day through elapsed time "24 hours" of the second day and elapsed time "48 hours" of the third day.

In the period "dark" from the elapsed time t31 to the elapsed time "72 hours", the voltage Va of the first storage battery 130 gradually decreases. In the example shown in FIG. 10, at an elapsed time t32 after the elapsed time "48 hours", if the voltage Va of the first storage battery 130 decreases to 2.6 V, the second switching unit 170 switches the second switcher 180 from the OFF state to the ON state. Accordingly, the first storage battery 130 is connected in parallel with the second storage battery 140, charging from the first storage battery 130 to the second storage battery 140 is performed, and the voltage Vb of the second storage battery 140 becomes the same voltage (Va=Vb) as the voltage Va of the first storage battery 130.

After the elapsed time t32, the voltages Va and Vb of the parallel circuit of the batteries are supplied to the load device 200. After the elapsed time t32, the load device 200 operates, and the voltages Va and Vb of the parallel circuit of the batteries decrease gradually and decreases to 2.5 V at an elapsed time 72.

In the period "dark" from the elapsed time "0 hours" to the elapsed time "72 hours", since the voltage Va of the first storage battery 130 and the voltages Va and Vb of the parallel circuit of the storage batteries exceed 2.5, the first switcher 160 maintains the ON state. Further, in the period "dark", since the voltage Va of the first storage battery 130 exceeds 2.5 V, the load device 200 continues to operate.

Thus, when the load device 200 is operated on a weekly basis, the power storage system 100 performs charging from the solar battery 110 to the first storage battery 130 to Friday (the first day) of a weekday, and operates the load device 200 using the power stored in the first storage battery 130 in a holiday (the second day and the third day).

At the elapsed time "72 hours", the voltage of the first storage battery 130 decreases to 2.5 V or lower. Accordingly, the load device 200 stops the operation, and the first switching unit 150 switches the first switcher 160 from the ON state to the OFF state. Thus, the first storage battery 130 is disconnected from the power supply line DCL1.

If the period "bright" begins immediately after the elapsed time "72 hours", the light begins to hit the solar battery 110, and the solar battery 110 starts power generation and starts charging of the second storage battery 140. In this case, the second storage battery 140 with a small capacitance (1 F) is rapidly charged by the solar battery 110, and the voltage Vb of the second storage battery 140 is charged from the voltage of 2.5 V at the time of the start of charging to a voltage of 2.7 V at the elapsed time t41 after 10 minutes (min) from the start of charging.

At the elapsed time t41, if the voltage of the second storage battery 140 increases to 2.7 V, the operation of the load device 200 returns and the load device 200 starts the measurement and communication operations. Further, at the elapsed time t41, the first switching unit 150 switches the first switcher 160 from the OFF state to the ON state. Accordingly, the first storage battery 130 is connected to the power supply line DCL1. The second switcher 180 maintains the ON state as it is.

After the elapsed time t41, the first switcher 160 and the second switcher 180 enter the ON state, and the voltages Va and Vb of the parallel circuit of the storage batteries (Va=Vb) appears at the Vout of the power supply line DCL1. In a period "bright" after the elapsed time t41, the solar battery 110 charges the parallel circuit of the first storage battery 130 and the second storage battery 140. Accordingly, the voltages Va and Vb of the parallel circuit of the storage batteries reach 2.8 V at a point in an elapsed time t42.

If the voltages Va and Vb of the parallel circuit of the storage batteries reach 2.8 V, the second switching unit 170 switches the second switcher 180 from the ON state to the OFF state. Accordingly, after the elapsed time t42, the second storage battery 140 is disconnected from the power supply line DCL1, and the voltage Vb of the second storage battery 140 decreases gradually due to a flow of a leakage current. After the elapsed time t42, the periods "bright" and "dark" are repeated and the voltage Va of the first storage battery 130 is changed. After the fourth day, the first storage battery 130 gradually stores power corresponding to an amount consumed by the load device 200 in the period "dark" of next Saturday and Sunday.

In the example shown in FIG. 10, the voltage Va of the first storage battery 130 begins to decrease from the elapsed time t31 and becomes 2.6 V at the elapsed time t32, and after the second switcher 180 enter the ON state, the voltages Va and Vb of the parallel circuit of the storage batteries just become 2.5 V at the elapsed time "72 hours". However, the voltage Va of the first storage battery 130 may reach, for example, 2.5 V midway on the third day in the case of three consecutive holidays. This is because continuous driving capability of the load device 200 required for the sensor node 10 is continuous driving for 60 hours.

Therefore, in the period "dark", a period which the first storage battery 130 and the second storage battery 140 are connected in parallel may last long without receiving the power from the solar battery 110. In this case, the voltages Va and Vb of the parallel circuit of the storage batteries greatly decrease (for example, decreases to 0 V) due to the leakage current of the second storage battery 140. However, even when the voltage Vb of the second storage battery 140 greatly decreases, the solar battery 110 can charge the second storage battery 140 in a speed of 40 times the speed at which the solar battery 110 charges the first storage battery 130 with large capacitance (40 F) since the second storage battery 140 with small capacitance (1 F) has small capacitance. Therefore, the power storage system 100 can cause the operation of the load device 200 to return in relatively short amount of time even when the voltage Vb of the second storage battery 140 greatly decreases.

Alternatively, in the power storage system 100, a capacitor with a low leakage current, such as a lithium ion capacitor, may be used as the second storage battery 140.

In the power storage system 100, a communication time interval of the load device 200 can be widened when the voltage Va of the first storage battery 130 is lower than a predetermined threshold voltage (voltage equal to or greater than the first threshold voltage). Accordingly, when the solar battery 110 does not perform power generation or when the generated power amount of the solar battery 110 is smaller than the power consumption amount of the load device 200, the power storage system 100 can reduce the amount of power that the first storage battery 130 supplies to the load device 200. Therefore, the power storage system 100 can widen a period in which the power is supplied to the load device 200.

As described above, the power storage system 100 of this embodiment includes the solar battery 110 (the power generator) that performs environmental power generation, the first storage battery 130 that is supplied with the power generated by the solar battery 110, the second storage battery 140 having smaller capacitance than that of the first storage battery 130, the first switcher 160 that connects or disconnects the second storage battery 140 to or from the power supply line DCL1 for the power generated by the solar battery 110 and the load device 200, the second switcher 180 that connects or disconnects the second storage battery 140 to or from the power supply line DCL1 for the power generated by the solar battery 110 and the load device 200, the first switching unit 150 that compares the voltage Vout supplied to the load device 200 with first and second predetermined threshold voltages and controls the first switcher 160 according to the comparison result, and the second switching unit 170 that compares the voltage Vout supplied to the load device 200 with the third and fourth predetermined threshold voltages and controls the second switcher 180 according to the comparison result.

The third threshold voltage (2.6 V) is set to be higher than the first threshold voltage (2.5 V), the second threshold voltage (2.7 V) is set to be higher than the third threshold voltage (2.6V), and the fourth threshold voltage (2.8 V) is set to be higher than the third threshold voltage (2.6 V). The first switching unit 150 performs control such that the first switcher 160 enters the open state when the voltage Vout supplied to the load device 200 becomes equal to or lower than the first threshold voltage (2.5 V), and performs control such that the first switcher 160 enters the connected state when the voltage Vout supplied to the load device 200 becomes equal to or higher than the second threshold voltage (2.7 V), and the second switching unit 170 performs control to cause the second switcher 180 to enter the connected state so that the first storage battery 130 is connected in parallel with the second storage battery 140 when the voltage Vout supplied to the load device 200 becomes equal to or lower than the third threshold voltage (2.6 V) in a state in which the solar battery 110 stops the power generation, and performs control to cause the second switcher 180 to enter the open state so that the second storage battery 140 connected in parallel with the first storage battery 130 is disconnected from the first storage battery 130 when the voltage Vout supplied to the load device 200 becomes equal to or higher than the fourth threshold voltage (2.8 V).

Further, in the power storage system 100 having such a configuration, in a state in which the solar battery 110 stops the power generation, the first storage battery 13 supplies the power to be consumed when the load device 200 operates. Accordingly, the charging voltage Va thereof (the voltage Vout to be supplied to the load device 200) gradually decreases.

When the charging voltage Va of the first storage battery 130 decreases to 2.6 V (the third threshold voltage), the second switching unit 170 causes the second switcher 180 to enter the connected state and connects the second storage battery 140 in parallel with the first storage battery 130. Accordingly, the charging from the first storage battery 130 to the second storage battery 140 is performed and the charging voltage Vb of the second storage battery 140 increases.

Thereafter, when the charging voltages Va and Vb of the parallel circuit of the first storage battery 130 and the second storage battery 140 (the voltage Vout that is supplied to the load device 200) further decrease to 2.5 V (the first threshold voltage), the first switching unit 150 causes the first switcher 160 to enter the open state and disconnects the first storage battery 130 from the power supply line DCL1 and the load device 200.

Thereafter, when the solar battery 110 performs the power generation, the solar battery 110 starts charging of the second storage battery 140 via the second switcher 180.

When the charging voltage Vb of the second storage battery 140 (the voltage Vout that is supplied to the load device 200) reaches 2.7 V (the second threshold voltage), the first switching unit 150 causes the first switcher 160 to enter the connected state, connects the first storage battery 130 to the power supply line DCL1 and the load device 200 again, and connects the first storage battery 130 in parallel with the second storage battery 140.

Thereafter, when the charging continues from the solar battery 110 to the parallel circuit of the first storage battery 130 and the second storage battery 140 and the charging voltages Va and Vb of the parallel circuit (voltage Vout that is supplied to the load device 200) reach the voltage of 2.8 V (the fourth threshold value (fourth threshold value is greater than third threshold value)), the second switching unit 170 causes the second switcher 180 to enter the open state and disconnects the second storage battery 140 from the first storage battery 130.

Thus, when the charging voltage Va of the first storage battery 130 decreases to 2.6 V (the third threshold voltage) in a state in which the solar battery 110 stops the power generation, the power storage system 100 of this embodiment connects the first storage battery 130 in parallel with the second storage battery 140, performs charging from the first storage battery 130 to the second storage battery 140, and increases the charging voltage Vb of the second storage battery 140 in advance.

Thereafter, when the solar battery 110 performs the power generation, the second storage battery 140 is selected and charging is performed from the solar battery 110. Accordingly, the voltage Vout that is supplied to the load device 200 rapidly increases.

Accordingly, in the power storage system 100 of this embodiment, when the solar battery 110 performs the power generation after the operation of the load device 200 stops, it is possible to cause the operation of the load device 200 to return in a short amount of time.

Since the charging voltage of the second storage battery 140 with small capacitance increases in a short amount of time, the charging voltage can increase to a voltage equal to or greater than the second threshold value in a short amount of time. Therefore, the power storage system 100 can cause the operation of the load device 200 to return in a short amount of time.

Further, when the voltage of the first storage battery 130 decreases to 2.6 V (the third threshold voltage), the second storage battery 140 is connected in parallel with the first storage battery 130 and the second storage battery 140 reaches the same voltage as that of the first storage battery 130. Therefore, if the voltage of the first storage battery 130 becomes equal to or lower than 2.5 V (the first threshold voltage), the first switcher 160 enters the open state, and the second switcher 180 enters the connected state, charging of the second storage battery 140 is started from the potential of the second storage battery 140 at that time. Therefore, the power storage system 100 can charge the second storage battery 140 to a voltage equal to or higher than 2.7 V (the second threshold voltage) in a short amount of time. Accordingly, the power storage system 100 can cause the operation of the load device 200 to return in a short amount of time.

Further, in the power storage system 100 of the embodiment, 2.6 V (the third threshold voltage) is set to a voltage at which the voltage Va of the first storage battery 130 does not become equal to or lower than 2.5 V (the first threshold voltage) when the first storage battery 130 is connected in parallel with the second storage battery 140 even when the voltage Vb of the second storage battery 140 is 0 V or has a value close to 0 V.

In the power storage system 100 having such a configuration, the third threshold voltage (2.6 V) is set so that a voltage when the voltages of the first storage battery 130 and the second storage battery 140 are combined becomes equal to or higher than 2.5 V (the first threshold voltage) by connecting the first storage battery 130 in parallel with the second storage battery 140 even when the voltage Vb of the second storage battery 140 is 0V.

Accordingly, when the voltage Va of the first storage battery 130 becomes the third threshold voltage and the first storage battery 130 is connected in parallel with the second storage battery 140, it is possible to prevent the voltage Va of the first storage battery 130 from being equal to or lower than the first threshold voltage (for example, 2.5 V).

Further, in the power storage system 100 according to the embodiment, the first storage battery 130 is a type of capacitor with a leakage current lower than that of the second storage battery 140.

In the power storage system 100 having such a configuration, the first storage battery 130 is a capacitor that holds power for a long amount of time. In order for stored power not to be wastefully consumed, a capacitor with a low leakage current is used as the first storage battery 130. On the other hand, the second storage battery 140 is a capacitor that is used only in a short amount of time from a point in time at which the second storage battery 140 is connected in parallel with the first storage battery 130 due to the charging voltage Va of the first storage battery 130 decreasing to 2.6 V (the third threshold voltage) or lower to a point in time at which the charging voltages Va and Vb of the first storage battery 130 and the second storage battery 140 reach 2.8 V (the fourth threshold voltage) when the solar battery 110 (the power generator) performs power generation. Therefore, in the power storage system 100, a capacitor with a high leakage current can be used as the second storage battery 140.

Accordingly, the first storage battery 130 can hold the power for a long amount of time without wastefully consuming the stored power. Therefore, the power storage system 100 of this embodiment can operate the load device 200 for a long amount of time even when the solar battery 110 stops the power generation or when the power generation amount of the solar battery 110 is smaller than the power consumption amount of the load device 200.

In the embodiments, the power storage system 100 includes the DC/DC converter 115 that converts the output voltage Vs of the solar battery 110 (power generator) into a predetermined voltage and supplies the voltage to the first storage battery 130 and the second storage battery 140, and the DC/DC converter 115 controls the output voltage so that the charging voltage Va of the first storage battery 130 does not exceed a predetermined upper limit voltage (for example, 3.7 V).

In the power storage system 100 having such a configuration, the DC/DC converter 115 is connected to the output side of the solar battery 110 (power generator). The DC/DC converter 115 converts the output voltage Vs of the solar battery 110 into a voltage according to the power supply voltage to be supplied to the load device 200.

The DC/DC converter 115 performs, using the converted voltage, supply of power to the first storage battery 130 when the first switcher 160 is in a connected state, performs supply of power to the second storage battery 140 when the second switcher 180 is in the connected state, and performs charging of the parallel circuit of the first storage battery 130 and the second storage battery 140 when the first switcher 160 and the second switcher 180 are in the connected state. Further, the DC/DC converter 115 performs control so that the output voltage does not exceed a predetermined upper limit voltage, to thereby prevent the first storage battery 130 from being overcharged.

Accordingly, the power storage system 100 according to the embodiment can convert the output voltage of the solar battery 110 (power generator) into a voltage capable of operating the load device 200. Further, the DC/DC converter 115 can prevent the first storage battery 130 from being overcharged.

Further, in the power storage system 100, a lithium ion capacitor is used as the first storage battery 130.

In the power storage system 100 having such a configuration, it is necessary for the first storage battery 130 with large capacitance to hold charge for a long amount of time. Therefore, a lithium ion capacitor with a low leakage current is used as the first storage battery 130.

Thus, the first storage battery 130 can hold the power supplied from the solar battery 110 (power generator) for a long amount of time by preventing the power from being wastefully consumed. Therefore, the power storage system 100 of this embodiment can operate the load device 200 for a long amount of time when the solar battery 110 stops the power generation or when the generated power amount of the solar battery 110 is smaller than the power consumption amount of the load device 200.

Second Embodiment

Figure 11:
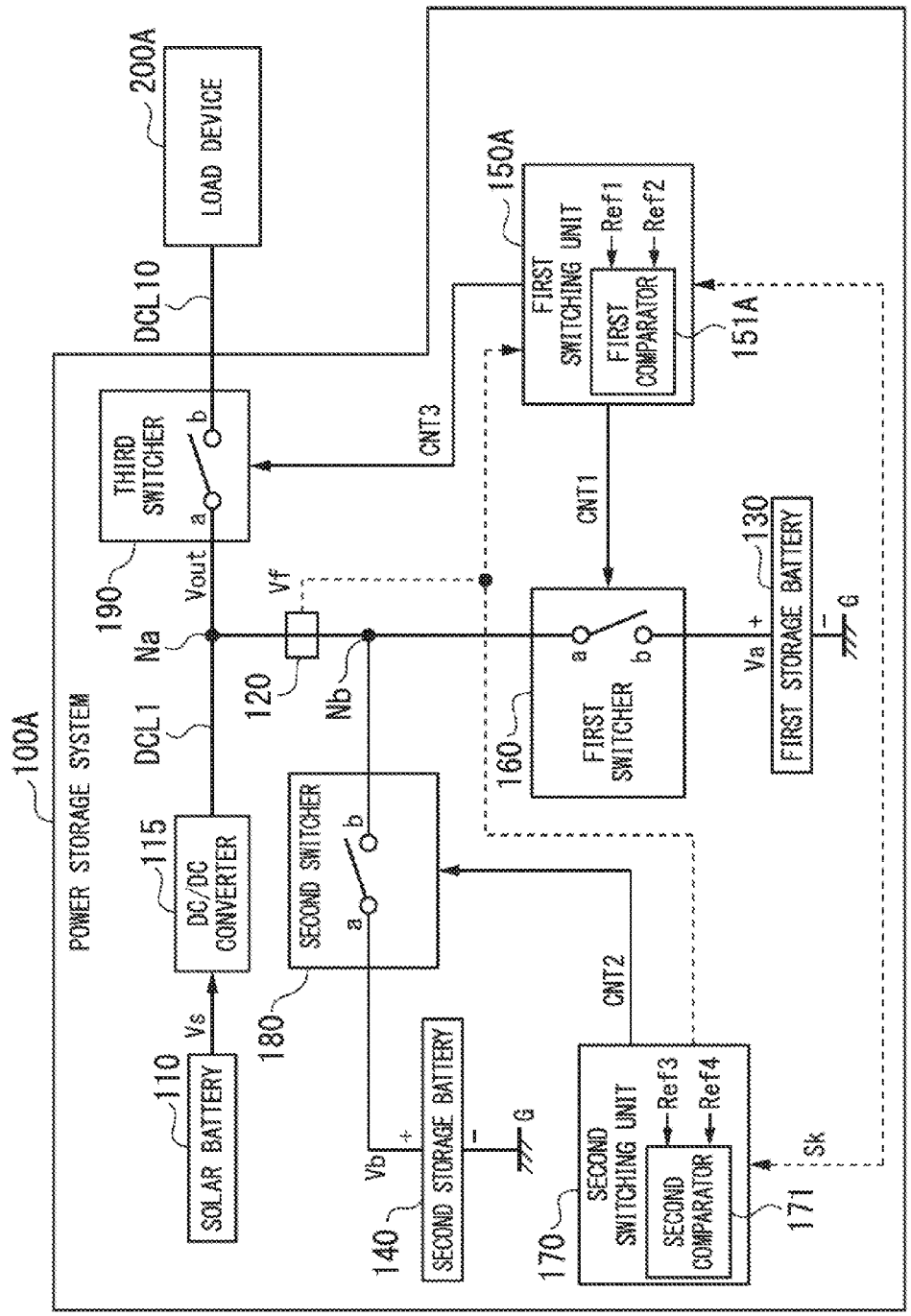
FIG. 11 is a configuration diagram showing a configuration example of a power storage system according to a second embodiment.

FIG. 11 is a configuration diagram showing a configuration example of a power storage system 100A according to this embodiment. The power storage system 100A shown in FIG. 11 is different from the power storage system 100 shown in FIG. 2 in that a third switcher 190 is newly added, the first switching unit 150 is replaced with a first switching unit 150A, and the load device 200 is replaced with a load device 200A. Further, the load device 200A is different from the load device 200 in that the load device 200A is configured to just start an operation if the load device 200A receives supply of a power supply voltage exceeding 2.5 V that is an input power supply specification. Other configurations are the same as those of the power storage system 100 shown in FIG. 2. Therefore, the same components are denoted with the same reference numerals, and a repeated description will be omitted.

In FIG. 11, the third switcher 190 has one terminal a connected to a power supply line DCL10, and the other terminal b connected to a power input line DCL10 of the load device 200A. The third switcher 190 enters an ON state or an OFF state according to instruction content of a control signal CNT3 input from the first switching unit 150A.

Accordingly, the first switcher 160 connects or disconnects between a power supply line DCL1 and the power input line DCL10 of the load device 200A. That is, when the third switcher 190 enters a connected state, the power supply line DCL1 is connected to the power input line DCL10 and the power is supplied from the power storage system 100A to the load device 200A. Since the third switcher 190 enters the open state, the connection between the power supply line DCL1 and the power input line DCL10 is opened, and the supply of power from the power storage system 100A to the load device 200A is stopped.

In the following description, the third switcher 190 being in the connected state is described as the third switcher 190 being in an ON state, and the third switcher 190 being in an open state is described as the third switcher 190 being in an OFF state.

The first switching unit 150A includes a first comparator 151A, and the first comparator 151A determines whether or not the output voltage Vout of the power supply line DCL1 (in this case, the voltages Va and Vb of the parallel circuit of the storage batteries) is equal to or lower than 2.5 V (the first threshold voltage) in a state in which the first switcher 160 and the second switcher 180 are in the ON state. Further, when the first switcher 160 is in the OFF state and the second switcher 180 is in the ON state, the first comparator 151A determines whether or not the output voltage Vout of the power supply line DCL1 (in this case, the voltage vb of the second storage battery 140) is equal to or higher than 2.7 V.

When the voltages Va and Vb of the parallel circuit of the storage batteries are equal to or lower than 2.5 V, the first switching unit 150A outputs the control signal CNT1 to the first switcher 160 to cause the first switcher 160 to enter the OFF state. When the voltages Va and Vb of the parallel circuit of the storage batteries are equal to or lower than 2.5 V (the first threshold voltage), the first switching unit 150A outputs the control signal CNT3 to the third switcher 190 to cause the third switcher 190 to enter the OFF state. Accordingly, the power storage system 100A stops the supply of power to the load device 200A.

Further, when the voltage Vb of the second storage battery 140 is equal to or higher than 2.7 V (the second threshold voltage) after the first switching unit 150A causes the first switcher 160 to enter the OFF state, the first switching unit 150A outputs the control signal CNT1 to the first switcher 160 to cause the first switcher 160 to enter the ON state. When the voltage Vb of the second storage battery 140 becomes equal to or higher than 2.7 V (the second threshold voltage), the first switching unit 150A outputs the control signal CNT3 to the third switcher 190 to cause the third switcher 190 to enter the ON state. Accordingly, the power storage system 100A supplies the power to the load device 200A.

Thus, in the power storage system 100A, the first switcher 160 of the first switcher 160 and the third switcher 190 of the third switcher 190 are turned ON or OFF under the same conditions. That is, when the first switcher 160 of the first switcher 160 is in the ON state, the third switcher 190 of the third switcher 190 enters the ON state, and when the first switcher 160 of the first switcher 160 is in the OFF state, the third switcher 190 of the third switcher 190 enters the OFF state.

When the voltage Vb of the second storage battery 140 becomes equal to or higher than 2.7 V, the first switching unit 150A may cause the third switcher 190 to enter the ON state earlier than the first SW 161 so that power is supplied from the second storage battery 140 to the load device 200A. In this case, the first switching unit 150A causes the second switcher 180 to enter the ON state after the load device 200A repeats the measurement and communication operations several times.

Further, the first switching unit 150A and the second switching unit 170 may notify each other of information on the open or closed state of the first switcher 160 and the third switcher 190 and information on the open or closed state of the second switcher 180 via the signal line Sk. Accordingly, the first switching unit 150A can confirm the open or closed state of the second switcher 180 to control the open or closed state of the first switcher 160 and the third switcher 190. Further, the second switching unit 170 can confirm the open or closed state of the first switcher 160 and the third switcher 190 to control the open or closed state of the second switcher 180.

Thus, by using the power storage system 100A, it is not necessary for the load device 200A itself to determine a magnitude of the power supply voltage supplied by the output voltage Vout of the power supply line DCL1, and if the third switcher 190 enters an ON state and the power supply voltage is supplied from the power storage system 100A, the operation can immediately start.

Figure 13A:
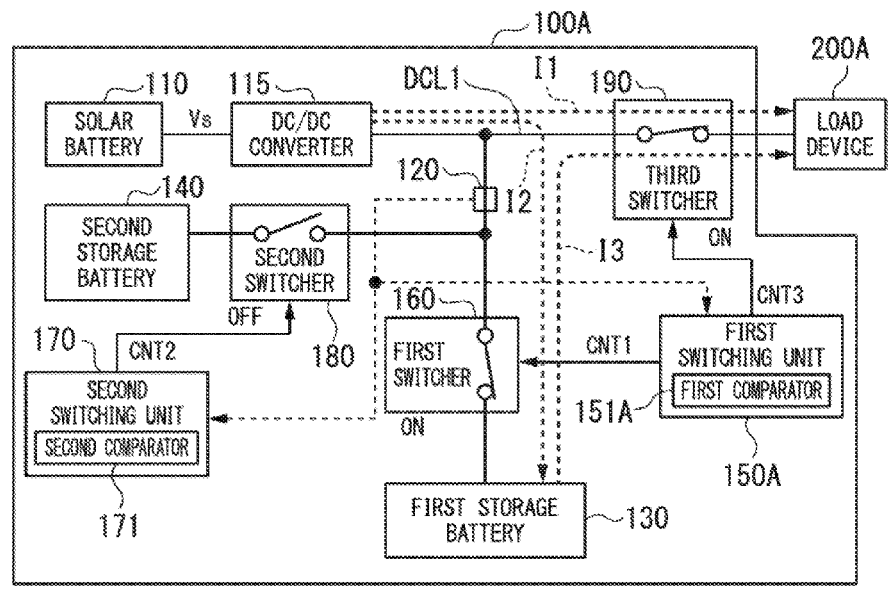
FIG. 13A is an illustrative diagram showing a power supply state in the normal state of the power storage system according to the second embodiment.
Figure 13B:
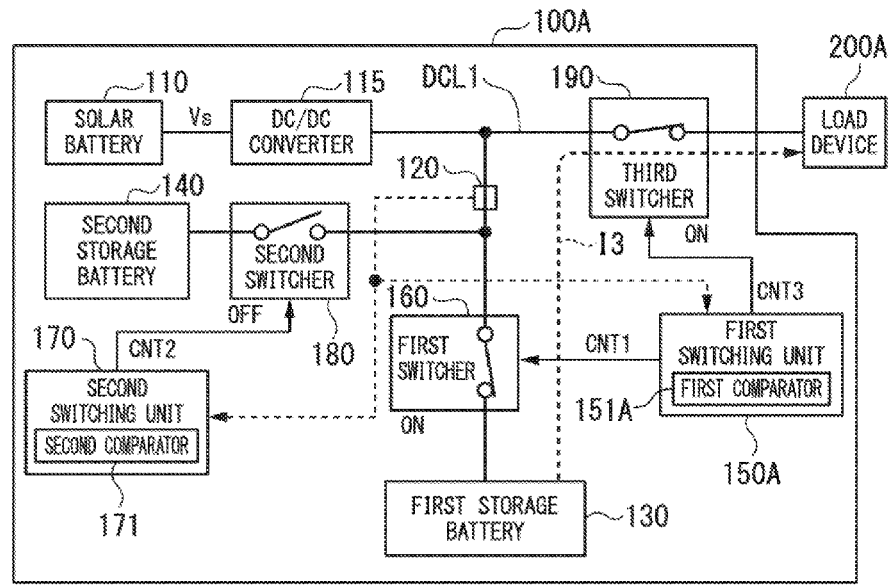
FIG. 13B is an illustrative diagram showing a power supply state in the normal state of the power storage system according to the second embodiment.
Figure 14A:
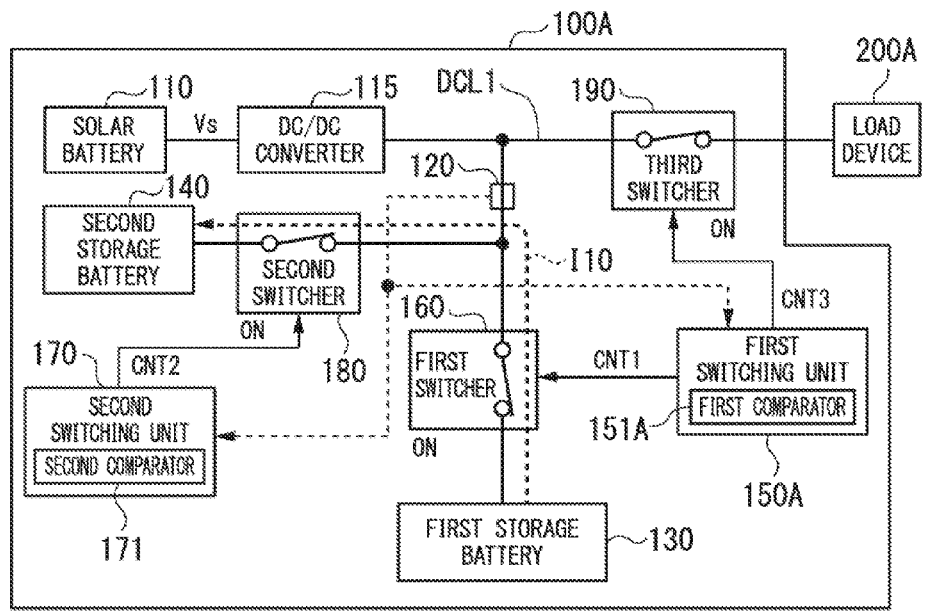
FIG. 14A is an illustrative diagram showing a power supply state before the voltage close to the over-discharge state is reached in the power storage system according to the second embodiment.
Figure 14B:
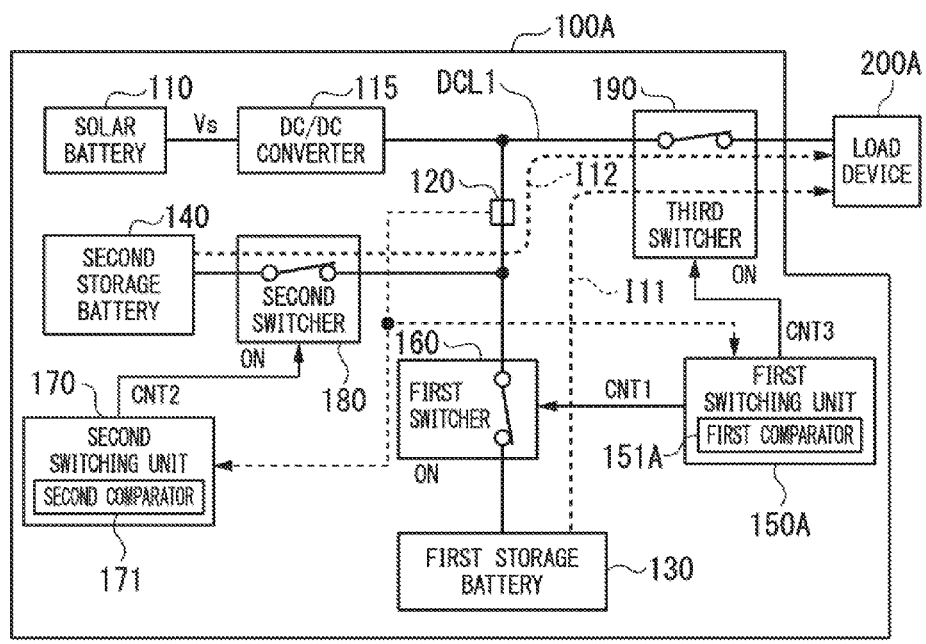
FIG. 14B is an illustrative diagram showing a power supply state before the voltage close to the over-discharge state is reached in the power storage system according to the second embodiment.
Figure 15A:
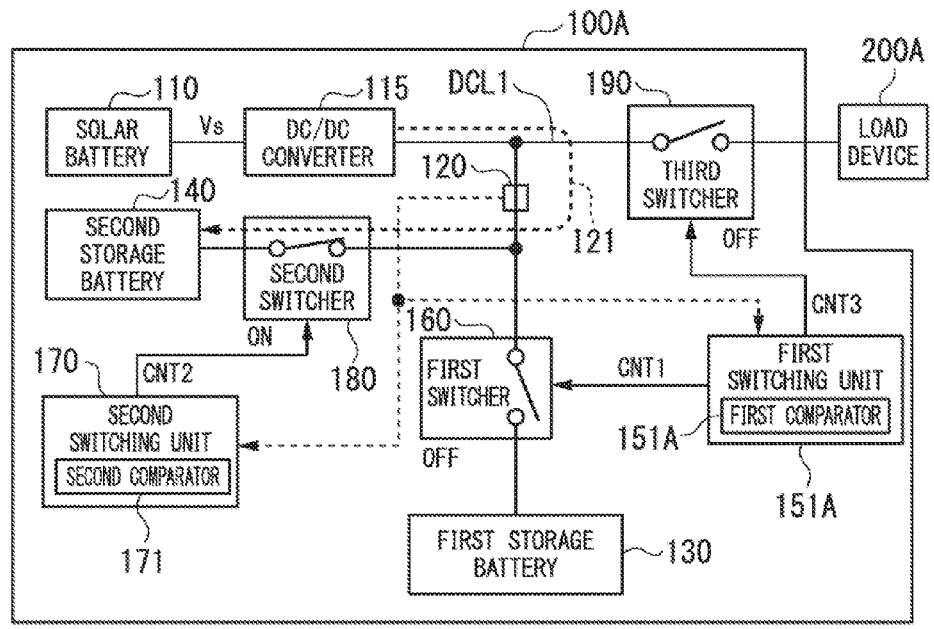
FIG. 15A is an illustrative diagram showing a power supply state at the time of an operation of returning to the normal state of the power storage system according to the second embodiment.
Figure 15B:
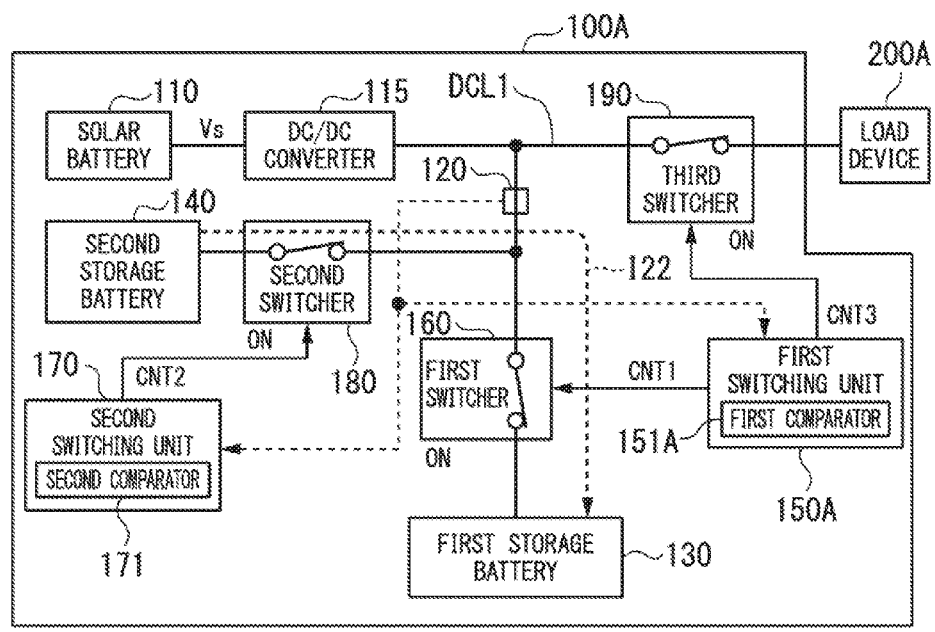
FIG. 15B is an illustrative diagram showing a power supply state at the time of an operation of returning to the normal state of the power storage system according to the second embodiment.

Further, FIG. 12 is an image diagram showing a case in which the power storage system 100A according to this embodiment transitions from a normal state to a state of a voltage close to an over-discharge state and then returns to the normal state again. Further, FIGS. 13A and 13B are illustrative diagrams showing a power supply state in the normal state of the power storage system 100A according to this embodiment. FIGS. 14A and 14B are illustrative diagrams showing a power supply state before the voltage close to the over-discharge state is reached in the power storage system 100A according to this embodiment. FIGS. 15A and 15B are illustrative diagrams showing a power supply state at the time of an operation of returning to the normal state of the power storage system 100A according to this embodiment.

Hereinafter, an operation in a case in which the first storage battery 130 enters a state of a voltage close to an over-discharge state, the load device 200A stops an operation, the solar battery 110 starts the power generation again, and then, the power storage system 100A returns to a normal state will be described with reference to FIGS. 12 to 15B.

PART (A) of FIG. 12 shows a change in the voltage Va of the first storage battery 130 and a change in the voltage Vb of the second storage battery 140 in a conceptual image, in which a vertical axis indicates a voltage (V) and a horizontal axis indicates an elapsed time (h: hour). Further, PART (B) of FIG. 12 shows, in a table, a change in the storage battery in operation involved in a charging or discharging operation, an ON/OFF state of the first switcher 160, an ON or OFF state of the second switcher 180, and an ON or OFF state of the third switcher 190 in respective periods T11 to T15 shown in PART (A) of FIG. 12.

FIG. 12 is different from FIG. 5 described above only in that the change in the ON or OFF state of the third switcher 190 is added in PART (B) of FIG. 12. The other portions are the same as those of FIG. 5, and a repeated description thereof will be omitted.

In FIG. 12, at the time t51, the power storage system 100A operates in the normal state in which the first storage battery 130 is not in the state of the voltage close to the over-discharge state. That is, at this time t51, the voltage Va of the first storage battery 130 is approximately 3.5 V, the first switcher 160 is in the ON state, the second switcher 180 is in the OFF state, and the third switcher 190 is in the ON state.

In the normal state of the power storage system 100A, for example, as shown in FIG. 13A, when the power generated by the solar battery 110 is sufficiently high, for example, when the output voltage of the DC/DC converter 115 that performs voltage conversion of the output voltage Vs of the solar battery 110 is 3.5 V or the like, the DC/DC converter 115 flows a current I1 in the load device 200A via the third switcher 190 to supply the power, and supplies a charging current I2 in the first storage battery 130 via the first switcher 160. Further, for the power to be consumed in the load device 200, when the current I1 flowing from the DC/DC converter 115 to the load device 200A is insufficient, the first storage battery 130 flows a current I3 in the load device 200A via the first switcher 160 and the third switcher 190 to supply the power.

On the other hand, as shown in FIG. 13B, when the solar battery 110 does not perform power generation and the power is not supplied from the DC/DC converter 115, the first storage battery 130 flows the current I3 in the load device 200 via the first switcher 160 and the third switcher 190 to supply the power.

Referring back to FIG. 12, description of FIG. 12 will be continued. In FIG. 12, in a period T1 of "dark" from the time t51 to the time t52, the first switcher 160 is in the ON state, the second switcher 180 is in an OFF state, and the third switcher 190 is in an ON state.

In the period T11, the supply of power is not performed from the solar battery 110 to the first storage battery 130, and the load device 200A operates periodically. Accordingly, as shown in FIG. 13B, a current I3 flows from the first storage battery 130 to the load device 200A, and the charging voltage Va of the first storage battery 130 gradually decreases. On the other hand, since the second switcher 180 is in the OFF state, the charging is not performed from the solar battery 110 and the voltage Vb of the second storage battery 140 is substantially 0 V.

At the time t52, if the voltage Va of the first storage battery 130 decreases to 2.6 V (the third threshold voltage), the power storage system 100A enters a period T12 in which is a state before the voltage close to the over-discharge state is reached. Further, this period T12 is a time zone of "dark".

In the period T12, the second switching unit 170 switches the second switcher 180 from the OFF state to the ON state, and the first switching unit 150A maintains the ON state of the first switcher 160 and the third switcher 190 at it is. Accordingly, at the time t52, the first storage battery 130 and the second storage battery 140 are connected in parallel. Accordingly, the second storage battery 140 is charged with the charge stored in the first storage battery 130. That is, charge redistribution is performed between the first storage battery 130 and the second storage battery 140, and the voltage Va of the first storage battery 130 and the voltage Vb of the second storage battery 140 instantaneously become the same voltage "2.5 V+ΔV1 (approximately 0.04V)."

For example, as shown in FIG. 14A, since the second switcher 180 is turned ON, a charging current I10 flows from the first storage battery 130 to the second storage battery 140, and the voltage Va of the first storage battery 130 and the voltage Vb of the second storage battery 140 instantaneously become the same voltage (Va=Vb).

In the period T12, since the first switcher 160 and the second switcher 180 are in the ON state, the voltage Va of the first storage battery 130 and the voltage Vb of the second storage battery 140 become the same voltage (Va=Vb). In the period T12, since the supply of power is not performed from the solar battery 110 to the first storage battery 130 and the second storage battery 140 and the load device 200A operates periodically, a current I11 flows from the first storage battery 130 to the load device 200A via the first switcher 160 and the third switcher 190, as shown in FIG. 14B. Further, a current I12 flows from the second storage battery 140 to the load device 200A via the second switcher 180 and the third switcher 190. Accordingly, the voltages Va and Vb (Va=Vb) of the parallel circuit of the storage batteries gradually decrease.

At the time t53, the voltages Va and Vb of the parallel circuit of the storage batteries decrease to 2.5 V (the first threshold voltage). Accordingly, the state of the voltage close to the over-discharge state of the first storage battery 130 is reached. If the voltages Va and Vb of the parallel circuit of the storage batteries decrease to 2.5 V, the first switching unit 150A switches the first switcher 160 from the ON state to the OFF state and switches the third switcher 190 from the ON state switch to the OFF state. Accordingly, the power storage system 100A stops the supply of power to the load device 200A, and the load device 200A stops the operation. Further, the first storage battery 130 is disconnected from the power supply line DCL1.

Immediately after the time t53, a period T13 of "bright" starts, and the solar battery 110 starts the power generation again. In this period T13, the first switcher 160 is in the OFF state, the second switcher 180 is in the ON state, and the third switcher 190 is in the OFF state.

Therefore, from the time t53, the solar battery 110 supplies the charging current I21 only to the second storage battery 140, as shown in FIG. 15A. Accordingly, the second storage battery 140 with small capacitance (1 F) is rapidly charged by the solar battery 110. At a time t54 after 10 minutes (min) from the start of charging, the voltage Vb of the second storage battery 140 increases to 2.7 V (the second threshold voltage). The voltage Vb of the second storage battery 140 is output to the load device as the output voltage Vout of the power supply line DCL1.

On the other hand, since the voltage Va of the first storage battery 130 is maintained at 2.5 V as it is since the first switcher 160 is in the OFF state.

At the time t54, if the voltage Vb of the second storage battery 140 reaches 2.7 V (the second threshold voltage), the first switching unit 150A switches the third switcher 190 from the OFF state to the ON state. Accordingly, the power is supplied from the power storage system 100A to the load device 200A again, and the load device 200A returns to the operation and resumes the measurement and communication operations.

Subsequently, the first switching unit 150A switches the first switcher 160 from the OFF state to the ON state to connect the first storage battery 130 in parallel with the second storage battery 140. Accordingly, as shown in FIG. 15B, a charging current I22 flows from the second storage battery 140 to the first storage battery 130, and the voltage Va of the first storage battery 130 and the voltage Vb of the second storage battery 140 instantaneously become the same voltage "2.5 V+ΔV2 (for example, approximately 0.005 V)." The load device 200A can continue to operate as it is since the voltage Vout of the power supply line DCL1 exceeds 2.5 V even when the voltage Vout of the power supply line DCL1 decreases from 2.7 V to "2.5 V+ΔV2".

In a period T14 after the time t54, all of the first switcher 160, the second switcher 180, and the third switcher 190 enter an ON state, and charging is performed from the solar battery 110 to the parallel circuit of the first storage battery 130 and the second storage battery 140. Accordingly, in the period T14, the voltage Va of the first storage battery 130 and the voltage Vb of the second storage battery 140 become the same voltage (Va=Vb). Since the first storage battery 130 and the second storage battery 140 are charged from the solar battery 110, the voltages Va and Vb of the parallel circuit of the storage batteries increase gradually.

At a time t55, if the voltages Va and Vb of the parallel circuit of the storage batteries reach a voltage of 2.8 V (the fourth threshold voltage), the second switching unit 170 switches the second switcher 180 from the ON state to the OFF state. On the other hand, the first switching unit 150A maintains the ON state of the first switcher 160 and the ON state of the third switcher 190 as they are. Accordingly, in a period T15 after from the time t55, the second storage battery 140 is disconnected from the power supply line DCL1, and the voltage Vb of the second storage battery 140 gradually decreases due to a leakage current. On the other hand, since the charging from the solar battery 110 to the second storage battery 140 continues, the voltage Va of the first storage battery 130 further increases after the time t55.

Accordingly, the power storage system 100A returns, in a short amount of time, the operation of the load device 200A that has temporarily stopped due to the first storage battery 130 with large capacitance entering the state of the voltage close to the over-discharge state when the solar battery 110 performs power generation. Further, it is not necessary for the load device 200A itself to determine a magnitude of the supply voltage supplied by the output voltage Vout of the power supply line DCL1, and if the third switcher 190 enters the ON state and the power supply voltage is supplied from the power storage system 100A, the load device 200A can immediately start the operation.

FIG. 16 is a flowchart showing a procedure of a process in the power storage system 100A according to this embodiment. The flowchart shown in FIG. 16 is different from the flowchart shown in FIG. 9 only in that step S100 of FIG. 9 is replaced with step S100A, and steps S136 and S161 are newly added. Other process steps are the same as those in the flowchart shown in FIG. 9. That is, the flowchart shown in FIG. 16 is different from the flowchart shown in FIG. 9 only in that a processing step of ON/OFF (connection/open) of the third switcher 190 is newly added. Therefore, steps with the same process content are denoted with the same reference numerals and a description thereof will be omitted.

Referring to FIG. 16, in step S100A, first, the power storage system 100A is assumed to operate in a normal state. That is, in the power storage system 100A, it is assumed that the first switcher 160 is in the ON state, the second switcher 180 is in an OFF state, the third switcher 190 is in an ON state, the voltage Va of the first storage battery 130 exceeds 2.6 V, and the load device 200A is in operation.

Subsequently, a process from steps S105 to S135 that are performed for the power storage system 100A, that is, a process that is performed until the power storage system 100A enters a voltage state close to an over-discharge state of the first storage battery 130 from the normal state is the same as the process in the power storage system 100 shown in FIG. 9. In step S130, when the voltages Va and Vb of the parallel circuit of the storage batteries are determined to be equal to or lower than 2.5 V (step S130: No), the first switching unit 150A switches the third switcher 190 from the ON state to the OFF state, and stops the supply of power from the power storage system 100A to the load device 200A (step S136). Accordingly, the load device 200A stops the operation (step S140).

Subsequently, a process from step S145 to step S160, that is, charging is performed from the solar battery 110 to the second storage battery 140, and a process that is performed while the voltage Vb of the second storage battery 140 is charged from 2.5 V to 2.7 V is the same as the process in the power storage system 100 shown in FIG. 9. In step S160, if the voltage Vb of the second storage battery 140 is determined to be equal to or higher than 2.7 V (step S160: Yes), the first switching unit 150A switches the third switcher 190 from the OFF state to the ON state, and supply of power is started from the power storage system 100A to the load device 200A (step S161). Accordingly, the operation of the load device 200A returns and the load device 200A starts the measurement and communication operations (step S165).

Subsequently, a process from step S170 to step S190, that is, a process of supplying power from the solar battery 110 to the parallel circuit of the first storage battery 130 and the second storage battery 140, and a process in which the second switching unit 170 disconnects the second storage battery 140 from the power supply line DCL1 when the voltages Va and Vb of the parallel circuit of the storage batteries reach 2.8 V are the same as the processes in the power storage system 100 shown in FIG. 9.

Thus, in the power storage system 100A, the first switcher 160 and the third switcher 190 are turned ON or OFF at the same timing. That is, in the power storage system 100A, when the first switcher 160 is in the ON state, the third switcher 190 enters the ON state, and when the first switcher 160 is in the OFF state, the third switcher 190 enters the OFF state.

As described above, the power storage system 100A of the embodiment includes the third switcher 190 that connects or opens between the power supply line DCL1 that supplies power to the load device 200A and the load device 200A, and the first switching unit 150A performs control so that the third switcher 190 enters the open state when the voltage supplied to the load device 200A becomes equal to or lower than 2.5 V (the first threshold voltage), and performs control so that the third switcher 190 enters the connected state when the voltage Vout supplied to the load device 200A becomes equal to or higher than 2.7 V (the second threshold voltage) after the third switcher 190 enters the open state.

In the power storage system 100A having such a configuration, when the voltage supplied to the load device 200A becomes equal to or lower than 2.5 V (the first threshold voltage), the first switching unit 150A causes the third switcher 190 to enter the open state and stops the supply of power from the power storage system 100A to the load device 200A. On the other hand, when the charging voltage supplied to the load device 200A becomes equal to or higher than 2.7 V (the second threshold voltage) after the first switching unit 150A causes the third switcher 190 to enter the open state, the first switching unit 150A causes the third switcher 190 to enter the connected state and starts the supply of power from the power storage system 100A to the load device 200A.

Accordingly, the power storage system 100A can cause the third switcher 190 to enter the open state and stop the supply of power to the load device 200A in a state in which the power storage system 100A cannot supply required power to the load device 200A, and can cause the third switcher 190 to enter the connected state and supply the power to the load device 200A in a state in which the power storage system 100A can supply the required power to the load device 200A. Further, it is not necessary for the load device 200A itself to determine whether or not the power supply voltage supplied from the power storage system 100A is a power supply voltage necessary for the load device 200A itself to operate.

The invention has been described above, but the power storage system of the invention is not limited to only the illustrated examples described above and it is understood that various changes can be made without departing from the gist of the invention.

For example, in the examples shown in FIGS. 2 and 12, the example of the solar battery 110 using the environmental power generator as a power generator is illustrated, but the invention is not limited thereto. The power generator may be any power generator capable of performing environmental power generation. Here, the environmental power generation other than light is, for example, power generation using heat, vibration, wind power, or radio waves.

Further, although example in which the environment monitor device 210 includes the temperature sensor 211 and the humidity sensor 212 are shown in the example of the load device 200 shown in FIG. 2, the environment monitor device 210 may include any one of the temperature sensor 211 and the humidity sensor 212. Further, the environment monitor device 210 may include a sensor that determines information on other environments. The information on other environments is, for example, an illuminance, a $CO_2$ concentration, a vibration, a water level, a voltage, a current, sound, or an image.

Further, the power storage system 100 can be used as a power supply for opening and closing a door or a power supply for an electrical switch. When the power storage system is used for the power supply for opening and closing the door, or the like, a balance of the generated power amount and the power consumption amount may be negative, for example, even when light hits the solar battery 110 since the power supply for opening and closing a door or the power supply for an electrical switch has a different power consumption amount according to an installation environment or a use situation. In such a case, the power storage system 100 can be preferably used.

DESCRIPTION OF REFERENCE NUMERAL 100, 100A: Power storage system
110: Solar battery (power generator)
115: DC/DC converter
120: Voltage determiner
130: First storage battery
140: Second storage battery
150, 150A: First switching unit
151, 151A: First comparator
160: First switcher
170: Second switching unit
171: Second comparator
180: Second switcher 190: Third switcher
200, 200A: Load device
210: Environment monitor device
211: Temperature sensor
212: Humidity sensor
213: Wireless communicator They invention claimed is:

1. A power storage system, comprising:
a power generator that performs environmental power generation;
a first storage battery that is supplied with power generated by the power generator;
a second storage battery having smaller capacitance than that of the first storage battery;
a first switcher that connects or disconnects the first storage battery to or from a power supply line for the power generated by the power generator and a load device;
a second switcher that connects or disconnects the second storage battery to or from the power supply line for the power generated by the power generator and the load device;
a first switching unit that compares a voltage supplied to the load device with first and second predetermined threshold voltages and controls the first switcher according to a result of the comparison; and
a second switching unit that compares the voltage supplied to the load device with third and fourth predetermined threshold voltages and controls the second switcher according to a result of the comparison,
wherein the third threshold voltage is set to be higher than the first threshold voltage, the second threshold voltage is set to be higher than the third threshold voltage, and the fourth threshold voltage is set to be higher than the third threshold voltage,
wherein the first switching unit
performs control such that the first switcher enters an open state when the voltage supplied to the load device becomes equal to or lower than the first threshold voltage,
performs control such that a current state of the first switcher is held when the voltage supplied to the load device becomes higher than the first threshold voltage and lower than the second threshold voltage, and
performs control such that the first switcher enters a connected state when the voltage supplied to the load device becomes equal to or higher than the second threshold voltage, and
wherein the second switching unit
performs control to cause the second switcher to enter the connected state so that the first storage battery is connected in parallel with the second storage battery when the voltage supplied to the load device becomes equal to or lower than the third threshold voltage,
performs control such that a current state of the second switcher is held when the voltage supplied to the load device becomes higher than the third threshold voltage and lower than the fourth threshold voltage, and
performs control to cause the second switcher to enter an open state so that the second storage battery connected in parallel with the first storage battery is disconnected from the first storage battery when the voltage supplied to the load device becomes equal to or higher than the fourth threshold voltage.

2. The power storage system according to claim 1, wherein the third threshold voltage is set to a voltage at which the voltage of the first storage battery does not become equal to or lower than the first threshold voltage when the first storage battery is connected in parallel with the second storage battery when the voltage of the second storage battery is 0 V or has a value close to 0 V.

3. The power storage system according to claim 1, further comprising:
a third switcher that connects or opens between the power supply line that supplies power to the load device and the load device,
wherein the first switcher
performs control so that the third switcher enters an open state when the voltage supplied to the load device becomes equal to or lower than the first threshold voltage, and
performs control so that the third switcher enters a connected state when the voltage supplied to the load device becomes equal to or higher than the second threshold voltage after the third switcher enters the open state.

4. The power storage system according to claim 1, wherein the first storage battery is a capacitor with a leakage current lower than that of the second storage battery.

5. The power storage system according to claim 1, further comprising:
a DC/DC converter that converts the output voltage of the power generator into a predetermined voltage and supplies the voltage to the first storage battery and the second storage battery,
wherein the DC/DC converter controls the output voltage so that the charging voltage of the first storage battery does not exceed a predetermined upper limit voltage.

6. The power storage system according to claim 1, wherein the first storage battery is a lithium ion capacitor.

7. A power storage method in the power storage system, the power storage system including a power generator that performs environmental power generation, a first storage battery that is supplied with power generated by the power generator, a second storage battery having smaller capacitance than that of the first storage battery, a first switcher that connects or disconnects the first storage battery to or from a power supply line for the power generated by the power generator and a load device, a second switcher that connects or disconnects the second storage battery to or from the power supply line for the power generated by the power generator and the load device, a first switching unit that compares a voltage supplied to the load device with first and second predetermined threshold voltages and controls the first switcher according to a result of the comparison, and a second switching unit that compares the voltage supplied to the load device with third and fourth predetermined threshold voltages and controls the second switcher according to a result of the comparison, wherein the third threshold voltage is set to be higher than the first threshold voltage, the second threshold voltage is set to be higher than the third threshold voltage, and the fourth threshold voltage is set to be higher than the third threshold voltage,
the power storage method comprising:
a step of performing, by the first switching unit, control such that the first switcher enters an open state when the voltage supplied to the load device becomes equal to or lower than the first threshold voltage, performing control such that a current state of the first switcher is held when the voltage supplied to the load device becomes higher than the first threshold voltage and lower than the second threshold voltage, and performing control such that the first switcher enters a connected state when the voltage supplied to the load device becomes equal to or higher than the second threshold voltage; and a step of performing, by the second switching unit, control to cause the second switcher to enter the connected state so that the first storage battery is connected in parallel with the second storage battery when the voltage supplied to the load device becomes equal to or lower than the third threshold voltage, performing control such that a current state of the second switcher is held when the voltage supplied to the load device becomes higher than the third threshold voltage and lower than the fourth threshold voltage, and performing control to cause the second switcher to enter an open state so that the second storage battery connected in parallel with the first storage battery is disconnected from the first storage battery when the voltage supplied to the load device becomes equal to or higher than the fourth threshold voltage.

* * * * *